United States Patent
Ohmuro et al.

(10) Patent No.: US 12,019,336 B2
(45) Date of Patent: Jun. 25, 2024

(54) OPTICAL LAMINATE COMPRISING A TWISTED ANGLE OF A REFRACTIVE INDEX ANISOTROPIC LAYER HAVING A TWISTED STRUCTURE, IMAGE DISPLAY DEVICE, AND GLASS COMPOSITE

(71) Applicant: FUJIFILM Corporation, Tokyo (JP)

(72) Inventors: Katsufumi Ohmuro, Kanagawa (JP); Naoyoshi Yamada, Kanagawa (JP); Fumitake Mitobe, Kanagawa (JP); Naoya Shibata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/046,059

(22) Filed: Oct. 12, 2022

(65) Prior Publication Data
US 2023/0099442 A1 Mar. 30, 2023

Related U.S. Application Data

(63) Continuation of application No. PCT/JP2021/011901, filed on Mar. 23, 2021.

(30) Foreign Application Priority Data

Apr. 14, 2020 (JP) .................................. 2020-072359
Mar. 4, 2021 (JP) .................................. 2021-034423

(51) Int. Cl.
*G02F 1/13363* (2006.01)
*G02F 1/00* (2006.01)
(Continued)

(52) U.S. Cl.
CPC ...... *G02F 1/133636* (2013.01); *G02F 1/0063* (2013.01); *G02F 1/133331* (2021.01); *G02F 1/1396* (2013.01)

(58) Field of Classification Search
CPC ............ G02F 1/133636; G02F 1/0063; G02F 1/1397; G02F 2413/15
See application file for complete search history.

(56) References Cited

U.S. PATENT DOCUMENTS

2009/0153783 A1* 6/2009 Umemoto .............. G02B 27/28
359/487.01
2010/0092784 A1 4/2010 Kamada et al.
(Continued)

FOREIGN PATENT DOCUMENTS

JP 2008-165201 A 7/2008
JP 2008-275976 A 11/2008
(Continued)

OTHER PUBLICATIONS

Office Action, issued by the Japanese Patent Office on Aug. 8, 2023, in connection with Japanese Patent Application No. 2022-515269.
(Continued)

*Primary Examiner* — Paul C Lee
(74) *Attorney, Agent, or Firm* — Edwards Neils LLC; Jean C. Edwards, Esq.

(57) ABSTRACT

Provided is an optical laminate, an image display device, and a glass composite which are capable of sufficiently shielding light emitted in a direction oblique to a normal direction of a film without occurrence of moire even in a case of being used in a combination with a high-definition image display device. The optical laminate includes, in order, at least a first light absorption anisotropic layer, a refractive index anisotropic layer formed of a one or more layers that contain a liquid crystal compound having a twisted structure, and a second light absorption anisotropic layer, in which the first light absorption anisotropic layer and the second light absorption anisotropic layer contain an anisotropic absorbing material and each have an absorption (Continued)

axis that is aligned at an angle of 60° to 90° with respect to a film surface.

18 Claims, 3 Drawing Sheets

(51) Int. Cl.
*G02F 1/1333* (2006.01)
*G02F 1/139* (2006.01)

(56) References Cited

U.S. PATENT DOCUMENTS

| | | |
|---|---|---|
| 2010/0271721 A1 | 10/2010 | Gaides et al. |
| 2015/0378068 A1 | 12/2015 | Hatanaka |
| 2017/0192231 A1 * | 7/2017 | Ichihashi ............ G03B 21/604 |
| 2019/0064557 A1 | 2/2019 | Yanai |
| 2019/0154896 A1 * | 5/2019 | Yanai ................... G02B 5/3016 |
| 2019/0250457 A1 | 8/2019 | Nishimura et al. |
| 2020/0218101 A1 * | 7/2020 | Ihas ..................... G02F 1/0136 |
| 2021/0173135 A1 | 6/2021 | Shibata et al. |

FOREIGN PATENT DOCUMENTS

| | | |
|---|---|---|
| JP | 2009-145776 A | 7/2009 |
| JP | 2009-244356 A | 10/2009 |
| JP | 4902516 B2 | 3/2012 |
| JP | 2016-027387 A | 2/2016 |
| JP | 6345732 B2 | 6/2018 |
| JP | 2018-200387 A | 12/2018 |
| JP | 2020-052327 A | 4/2020 |
| WO | WO-2016052367 A1 * | 4/2016 ............ B60K 35/00 |
| WO | 2017/199656 A1 | 11/2017 |
| WO | 2018/003380 A1 | 1/2018 |
| WO | WO-2018003380 A1 * | 1/2018 .......... G02B 5/1833 |
| WO | 2018/079854 A1 | 5/2018 |
| WO | 2019/141943 A1 | 7/2019 |
| WO | 2020/045216 A1 | 3/2020 |

OTHER PUBLICATIONS

Office Action, issued by the Japanese Patent Office on Apr. 4, 2023, in connection with Japanese Patent Application No. 2022-515269.
International Search Report issued in PCT/JP2021/011901 on Jun. 15, 2021.
Written Opinion issued in PCT/JP2021/011901 on Jun. 15, 2021.
International Preliminary Report on Patentability completed by WIPO on Oct. 13, 2022 in connection with International Patent Application No. PCT/JP2021/011901.

* cited by examiner

OPTICAL LAMINATE COMPRISING A TWISTED ANGLE OF A REFRACTIVE INDEX ANISOTROPIC LAYER HAVING A TWISTED STRUCTURE, IMAGE DISPLAY DEVICE, AND GLASS COMPOSITE

CROSS-REFERENCE TO RELATED APPLICATIONS

This application is a Continuation of PCT International Application No. PCT/JP2021/011901 filed on Mar. 23, 2021, which was published under PCT Article 21(2) in Japanese, and which claims priority under 35 U.S.C. § 119(a) to Japanese Patent Application No. 2020-072359 filed on Apr. 14, 2020 and Japanese Patent Application No. 2021-034423 filed on Mar. 4, 2021. The above applications are hereby expressly incorporated by reference, in their entirety, into the present application.

BACKGROUND OF THE INVENTION

1. Field of the Invention

The present invention relates to an optical laminate including a refractive index anisotropic layer which contains a liquid crystal compound having a twisted structure and a light absorption anisotropic layer in which an absorption axis is aligned at an angle of 60° to 90° with respect to a film surface, an image display device obtained by combining the optical laminate with a liquid crystal display or an organic EL display device, and a glass composite obtained by combining the optical laminate with glass.

2. Description of the Related Art

Image display devices such as liquid crystal display devices and organic EL display devices are frequently used as displays for smartphones, notebook computers, and the like. In recent years, since these devices have been thinner and lighter and are thus easily carried, the devices are used in public places, for example, transportation facilities such as trains and aircraft, libraries, and restaurants in many cases. Therefore, due to the need to protect personal information, confidential information, and the like, there is a demand for a technique for preventing the display contents of image display devices from being peeped by others.

Further, in recent years, the image display devices have also been used as in-vehicle displays installed in automobiles. As a result of an increase in size of in-vehicle displays, there is a problem that light emitted from the displays is reflected on the windshield, side glass, or the like and interferes with driving, and thus a technique for preventing reflected glare has been required.

In order to prevent peeping into a liquid crystal display device and control the viewing angle, a technique of using a light absorption anisotropic layer having an absorption axis in the thickness direction is known. For example, JP4902516B and WO2018/079854A suggest a polarizer related to a viewing angle control system formed of a film containing a dichroic substance and having an angle of 0° to 45° between an absorption axis and a normal line of a film surface.

For example, JP6345732B discloses a viewing angle control system in which light transmission regions and light absorption regions are alternately arranged in the plane of a film to limit emission of light in an oblique direction with respect to a normal direction of the film. Such a viewing angle control system is usually referred to as a louver film.

SUMMARY OF THE INVENTION

The louver film described in JP6345732B can sufficiently shield light emitted in the oblique direction with respect to the normal direction of the film, and thus has been commonly used for the purpose of preventing peeping into a notebook computer or the like and preventing reflected glare on the windshield, side glass, or the like of an in-vehicle display.

However, since the light transmission regions and the light absorption regions are alternately laminated at a pitch of approximately several tens of m in the louver film, the periodic structure interferes with the pixels of the image display device, and thus a stripe pattern referred to as moire is generated in some cases. Particularly, in recent years, since image display devices have high-definition pixels, the problem of moire has been more significant.

Further, since the louver film typically has a base material layer consisting of a polycarbonate film or the like and has a thickness of 300 μm or greater, the louver film is not easily bent. In recent years, some image display devices used as in-vehicle displays or the like have a curved display surface, and thus the louver film is difficult to apply to such image display devices.

Further, since the louver film controls the viewing angle in a longitudinal direction or a lateral direction, two sheets of louver films are required to be superimposed longitudinally and laterally in order to realize viewing angle control only in a front direction for the purpose of preventing peeping into a notebook computer or the like and preventing reflected glare on the windshield, side glass, or the like of an in-vehicle display, but there is a problem of degradation of the display quality due to a decrease in front brightness, moire, and image blur.

The viewing angle control systems described in JP4902516B and WO2018/079854A do not have a periodic structure that interferes with the pixels of the image display device and thus can be used without the occurrence of moire. Further, in the viewing angle control systems described in JP4902516B and WO2018/079854A, the polarizer has a thickness of several to several tens of m, and thus the entire thickness can be set to be small even in a case of including other base material layers. Therefore, the viewing angle control systems can easily be made to follow the curved surface.

However, according to the examination on the viewing angle control systems described in JP4902516B and WO2018/079854A conducted by the present inventors, since the transmittance in a direction oblique to the normal direction of the film cannot be sufficiently reduced and light emitted obliquely is insufficiently shielded, the light shielding performance is not enough for the viewing angle control systems to be used for the purpose of preventing peeping into a notebook computer or the like and preventing reflected glare on the windshield, side glass, or the like of an in-vehicle display.

Further, JP2008-165201A discloses a viewing angle control system having a configuration in which a λ/2 retardation layer is sandwiched between polarizers having a polarization axis in a vertical direction. However, according to the examination conducted by the present inventors, it was found that the transmittance in a direction oblique to the normal direction of the film cannot be sufficiently reduced and light emitted obliquely is insufficiently shielded even in the viewing angle control system described in JP2008-165201A.

The present invention has been made in view of the above-described circumstances, and an object thereof is to provide an optical laminate, an image display device, and a glass composite which are capable of sufficiently shielding light emitted in a direction oblique to a normal direction of a film without occurrence of moire even in a case of being used in a combination with a high-definition image display device.

As a result of intensive examination conducted by the present invention, it was found that the viewing angle can be satisfactorily controlled by combining a display device such as a liquid crystal display with an optical laminate including a refractive index anisotropic layer which contains a liquid crystal compound having a twisted structure and a light absorption anisotropic layer in which an absorption axis is aligned at an angle of 60° to 90° with respect to a film surface, on a display surface or on a backlight (BL) side.

<1> An optical laminate comprising, in order, at least: a first light absorption anisotropic layer; a refractive index anisotropic layer formed of a one or more layers that contain a liquid crystal compound having a twisted structure; and a second light absorption anisotropic layer, in which the first light absorption anisotropic layer and the second light absorption anisotropic layer contain an anisotropic absorbing material and each have an absorption axis that is aligned at an angle of 60° to 90° with respect to a film surface.

<2> The optical laminate according to <1>, in which the first light absorption anisotropic layer and the second light absorption anisotropic layer each have an absorption axis aligned at an angle of 80° to 90° with respect to the film surface.

<3> The optical laminate according to <1> or <2>, in which a twisted angle of the refractive index anisotropic layer having the twisted structure satisfies Expression I, $$135 \cdot (2n-1) \geq \text{twisted angle(degrees)} \geq 45 \cdot (2n-1) \quad \text{Expression I}$$

in Expression I, n represents a natural number.

<4> The optical laminate according to any one of <1> to <3>, further comprising: a first substrate and a second substrate which are respectively disposed on both surfaces of the refractive index anisotropic layer and at least one of which has a transparent electrode, in which the refractive index anisotropic layer is a liquid crystal cell, and the refractive index anisotropic layer, the first substrate, and the second substrate constitute a liquid crystal panel that is electrically birefringently switchable.

<5> The optical laminate according to <4>, in which the liquid crystal cell is a TN liquid crystal cell that is electrically birefringently switchable or a VATN liquid crystal cell that exhibits a twisted structure in a voltage applied state.

<6> The optical laminate according to any one of <1> to <3>, in which the refractive index anisotropic layer is formed by polymerizing a composition containing a disk-like liquid crystal compound or a rod-like liquid crystal compound fixed in a twistedly aligned state in a film thickness direction.

<7> The optical laminate according to any one of <1> to <6>, in which the anisotropic absorbing material is a dichroic substance.

<8> The optical laminate according to <7>, in which the dichroic substance is any one of a dichroic coloring agent, a carbon nanotube, or an anisotropic metal nanoparticle.

<9> The optical laminate according to <7> or <8>, in which in the first light absorption anisotropic layer and the second light absorption anisotropic layer, a liquid crystal compound and at least one kind of dichroic substance are aligned perpendicularly to a film surface.

<10> The optical laminate according to <8>, in which a material of the anisotropic metal nanoparticle is at least one selected from gold, silver, copper, or aluminum.

<11> The optical laminate according to any one of <1> to <10>, in which a polarizer in which a liquid crystal compound and a dichroic substance are aligned horizontally to the film surface is laminated on one or both of the first light absorption anisotropic layer and the second light absorption anisotropic layer.

<12> An image display device comprising: the optical laminate according to any one of <1> to <11>, which is disposed on a front surface of the image display device.

<13> An image display device comprising: the optical laminate according to any one of <1> to <11>, which is disposed between a liquid crystal cell and a backlight light source.

<14> An image display device comprising in order: the optical laminate according to any one of <1> to <11>; a retardation layer; and a polarizer in which an absorption axis is aligned horizontally to a film surface.

<15> The image display device according to any one of <12> to <14>, in which the image display device has a curved surface portion in a display portion.

<16> A glass composite comprising at least: glass; and the optical laminate according to any one of <1> to <11>.

<17> A glass composite which is a laminated glass having an interlayer between two sheets of plate glasses, in which the interlayer includes the optical laminate according to any one of <1> to <11>.

According to the present invention, it is possible to provide an optical laminate, an image display device, and a glass composite which have a high transmittance as viewed in a front direction and are capable of decreasing the transmittance in an oblique direction. Further, according to a preferred aspect of the present invention, it is possible to provide an image display device capable of electrically controlling a narrow visual field and a wide visual field by replacing a liquid crystal compound having a twisted structure with a TN liquid crystal cell or a VATN liquid crystal cell and electrically controlling the refractive anisotropy of a liquid crystal layer.

DESCRIPTION OF THE PREFERRED EMBODIMENTS

Figure 1:
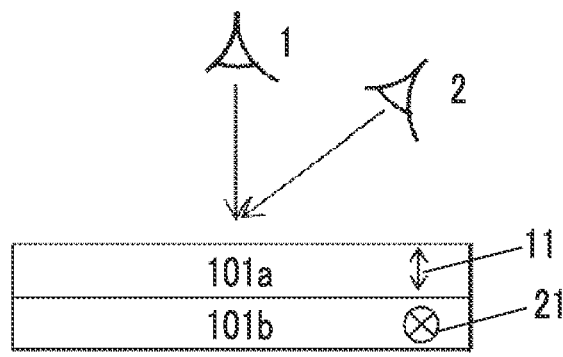
FIG. 1 is a schematic view illustrating a viewing angle control system of the related art.

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

In the present specification, the term parallel or orthogonal does not indicate parallel or orthogonal in a strict sense, but indicates a range of ±5° from parallel or orthogonal. Further, in the present specification, a polar angle denotes an angle formed between a film and a normal direction.

Further, in the present specification, the concepts of the liquid crystal composition and the liquid crystal compound also include those that no longer exhibit liquid crystallinity due to curing or the like.

Further, in the present specification, substances corresponding to respective components may be used alone or in combination of two or more kinds thereof. Here, in a case where two or more kinds of substances corresponding to respective components are used in combination, the content of the components indicates the total content of the combined substances unless otherwise specified.

Further, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

In the present invention, refractive indices nx and ny are refractive indices in the in-plane direction of an optical member, and typically, nx represents a refractive index of a slow axis azimuth and ny represents a refractive index of a fast axis azimuth (that is, the azimuth orthogonal to the slow axis). Further, nz represents a refractive index in the thickness direction. nx, ny, and nz can be measured with an Abbe refractometer (NAR-4T, manufactured by Atago Co., Ltd.) using a sodium lamp ($\lambda$=589 nm) as a light source. In a case of measuring the wavelength dependence, a multi-wavelength Abbe refractometer DR-M2 (manufactured by Atago Co., Ltd.) can be used in combination with an interference filter. In addition, values from Polymer Handbook (John Wiley & Sons, Inc.) and catalogs of various optical films can also be used.

In the present specification, Re ($\lambda$) and Rth ($\lambda$) respectively represent an in-plane retardation at a wavelength $\lambda$ and a retardation at a wavelength $\lambda$ in a thickness direction, and refractive indices nx, ny, and nz are represented by Equation (1) and Equation (2) using a film thickness d (μm).

$$Re(\lambda)=(nx-ny)\times d\times 1000 \text{ (nm)} \quad \text{Equation (1)}$$

$$Rth(\lambda)=((nx+ny)/2-nz)\times d\times 1000 \text{(nm)} \quad \text{Equation (2)}$$

The wavelength $\lambda$ is set to 550 nm unless otherwise specified.

The slow axis azimuth, Re ($\lambda$), and Rth ($\lambda$) can be measured using, for example, AxoScan OPMF-1 (manufactured by Opto Science Inc.).

In the present specification, $\Delta$nd denotes the retardation of a rod-like or disk-like liquid crystal compound having a twisted structure, a TN liquid crystal cell, or a VATN liquid crystal cell, and is represented by the product of a thickness d of a liquid crystal layer and a birefringence $\Delta$n of a liquid crystal. Further, the twisted angle denotes an angle at which a liquid crystal director of a refractive index anisotropic layer rotates on upper and lower surfaces of a substrate.

Further, it is preferable that the refractive index anisotropic layer having a twisted structure in the present invention satisfies the following expressions from the viewpoint of obtaining the effects of the present invention.

$$200 \text{ nm} \leq \Delta n \cdot d \leq 1500 \text{ nm} \quad \text{Expression (3)}$$

$$135\cdot(2n-1)\geq \text{twisted angle(degrees)}\geq 45\cdot(2n-1) \quad \text{Expression (4)}$$

In Expression (4), n represents a natural number.

Unless otherwise specified, $\Delta$n is defined as a value at a wavelength of 550 nm.

First, the mechanism for controlling the viewing angle of the viewing angle control system of the related art described in JP4902516B will be described.

FIG. 1 is a cross-sectional view illustrating a viewing angle control system of the related art which is formed by laminating a light absorption anisotropic layer 101a having an absorption axis 11 in the normal direction of the film and a second polarizer 101b having an absorption axis 21 in the in-plane direction of the film on a display device 200 such as a liquid crystal display, an organic EL display, or a LED display. As illustrated in FIG. 1, the absorption axis 11 is horizontal to a visual line direction in a case where the viewing angle control system is visually recognized from a front 1 (that is, in the normal direction of the film), and thus the light absorption anisotropic layer 101a does not absorb light traveling in the visual line direction. Therefore, the viewing angle control system of the related art transmits light.

Meanwhile, in a case where the viewing angle control system of the related art is visually recognized from an oblique azimuth 2, since the light absorption anisotropic layer 101a having the absorption axis 11 in the normal direction of the film is orthogonal to the azimuth (paper depth direction) of the absorption axis 21 of the second polarizer layer 101b having the absorption axis 21 in the in-plane direction of the film, light is not transmitted, and thus the light does not leak in the lateral direction. Further, in a case where the viewing angle control system of the related art is visually recognized in the longitudinal direction (paper depth direction; not illustrated), the light absorption anisotropic layer 101a having the absorption axis 11 in the normal direction of the film is parallel to the azimuth (paper depth direction) of the absorption axis 21 of the second polarizer layer 101b having the absorption axis 21 in the in-plane direction of the film, and thus light is transmitted. Therefore, it was found that the viewing angle control system of the related art cannot obtain sufficient light shielding properties in all azimuths and thus cannot obtain sufficient light shielding properties.

According to the present invention, it is possible to realize an optical laminate which has a high transmittance as viewed in a front direction and is capable of decreasing the transmittance in an oblique direction, and an image display device capable of shielding light in all oblique azimuths and capable of controlling a viewing angle with high security, which cannot be peeped into. Further, according to the present invention, it is possible to realize an image display device capable of electrically controlling a narrow visual field and a wide visual field and capable of controlling the viewing angle by replacing a liquid crystal compound having a twisted structure with a TN liquid crystal cell or a VATN liquid crystal cell and electrically controlling the refractive anisotropy of a liquid crystal layer.

(Basic Configurations of Optical Laminate and Image Display Device According to Embodiment of Present Invention)

Next, in the optical laminate and the image display device according to the embodiment of the present invention, the mechanism for expanding the light shielding angle range will be described.

Figure 2:
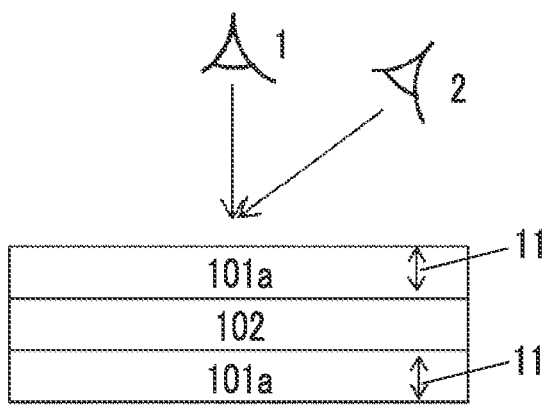
FIG. 2 is a schematic view illustrating an example of an image display device including an optical laminate of the present invention.

As a result of further examination conducted by the present inventors, it was found that oblique light in all azimuths can be shielded and the viewing angle can be satisfactorily controlled by laminating a (optically rotatory) refractive index anisotropic layer 102 having a 90° twisted structure between two sheets of light absorption anisotropic layers 101a each having the absorption axis 11 in the normal direction of the film on a display device 200 such as a liquid crystal display, an organic EL display, or a µLED display, as illustrated in FIG. 2. Further, it was also found that the effects of the present invention can be realized not only with a rod-like liquid crystal compound fixed in a twistedly aligned state in the film thickness direction, but also with a disk-like liquid crystal. Further, the structure is not limited to the 90° twisted structure as long as the structure exhibits the optically rotatory property, and more preferably, it was found that light can be shielded in an oblique azimuth and the viewing angle can be controlled by realizing a refractive index anisotropic layer having a twisted angle that satisfies Expression I.

$$135\cdot(2n-1) \geq \text{twisted angle(degrees)} \geq 45\cdot(2n-1) \quad \text{Expression I}$$

In Expression I, n represents a natural number.

Figure 3:
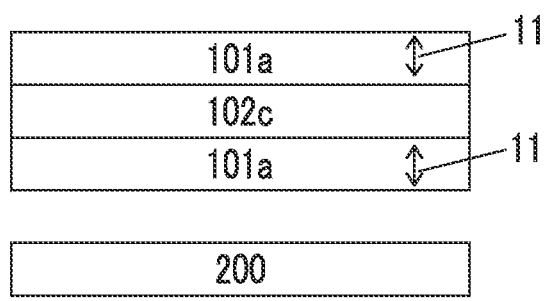
FIG. 3 is a schematic view illustrating another example of an image display device including an optical laminate of the present invention.

Further, as a result of intensive examination conducted by the present inventors, an image display device capable of controlling the viewing angle with high security, which can electrically switch between a security mode in which the transmittance as viewed in the front direction is high and the transmittance in an oblique direction can be decreased and a wide viewing angle mode in which the transmittance in the front direction and an oblique direction is high, is realized by using a TN type liquid crystal cell capable of electrically controlling the birefringence or a VATN type liquid crystal cell disclosed in JP1998-123576A (JP-H10-123576A) which exhibits a twisted structure in a voltage applied state as the liquid crystal cell 102c as illustrated in FIG. 3.

In a case where the optical laminate according to the embodiment of the present invention is observed in an oblique direction (certain polar angle direction) with respect to the film surface, the absorption axes 11 of two sheets of the light absorption anisotropic layers 101a are parallel to each other. The refractive index anisotropic layer 102 disposed between two sheets of the light absorption anisotropic layers 101a allows linearly polarized light that has been incident to rotate by approximately 90° in the polarization direction. Therefore, linearly polarized light that has passed through one of the light absorption anisotropic layers 101a is rotated due to the refractive index anisotropic layer 102 by approximately 90° in the polarization direction. In this manner, the polarization direction of the linearly polarized light rotated by the refractive index anisotropic layer 102 is substantially parallel to the direction of the absorption axis of the other light absorption anisotropic layer 101a, and the light is absorbed by the other light absorption anisotropic layer 101a. In this manner, light in an oblique direction with respect to the film surface is shielded. Here, since the refractive index anisotropic layer 102 can allow incident light to rotate regardless of the polarization direction of the linearly polarized light, oblique light in all azimuths can be shielded.

A λ/2 plate is known as an optical element that allows the polarization direction of linearly polarized light to rotate by 90°, but since the λ/2 plate acts only on linearly polarized light in a specific direction, oblique light in a specific azimuth can be shielded. However, oblique light cannot be shielded depending on the azimuth. On the contrary, according to the present invention, since a refractive index anisotropic layer having a twisted structure is used, oblique light in all azimuths can be shielded.

(One Example of Embodiment of Image Display Device of Present Invention)

Figure 4:
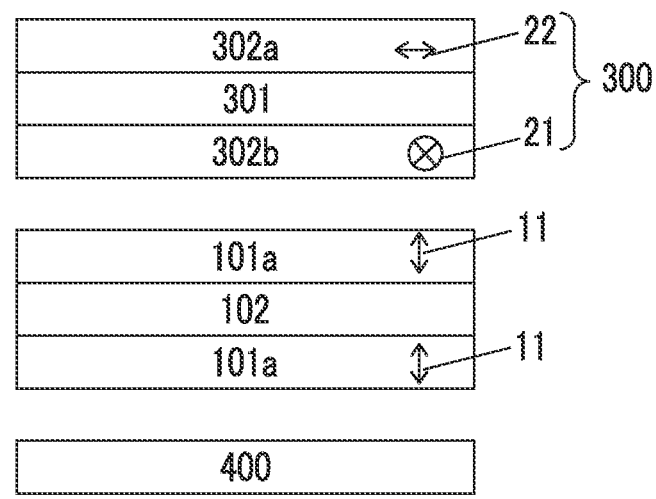
FIG. 4 is a schematic view illustrating still another example of an image display device including an optical laminate of the present invention.

As illustrated in FIG. 4, in a liquid crystal display (such as IPS, VA, or TN) formed of a surface light source 400 and a liquid crystal panel 300 that includes a liquid crystal cell 301, and polarizing plates 302a and 302b of crossed nicols disposed on the upper and lower surfaces of the liquid crystal cell 301, an image display device shielding oblique light in all azimuths can be realized by providing an optical laminate according to the embodiment of the present invention, which is obtained by laminating the (optically rotatory) refractive index anisotropic layer 102 having a 90° twisted structure between two sheets of the light absorption anisotropic layers 101a each having the absorption axis 11 in the normal direction of the film, between the liquid crystal panel 300 and the surface light source 400.

(Another Example of Embodiment of Optical Laminate and Image Display Device of Present Invention)

Figure 5:
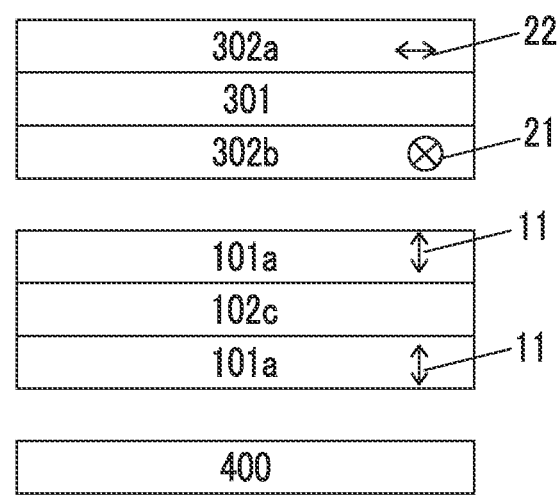
FIG. 5 is a schematic view illustrating even still another example of an image display device including an optical laminate of the present invention.

As illustrated in FIG. 5, an image display device capable of controlling the viewing angle with high security, which can electrically switch between a security mode in which the transmittance as viewed in the front direction is high and the transmittance in an oblique direction can be decreased and a wide viewing angle mode in which the transmittance in the front direction and an oblique direction is high, is realized by using a TN type liquid crystal cell capable of electrically controlling the birefringence or a VATN type liquid crystal cell disclosed in JP1998-123576A (JP-H10-123576A) which exhibits a twisted structure in a voltage applied state as the refractive index anisotropic layer in the configuration of FIG. 4.

That is, a liquid crystal panel including a refractive index anisotropic layer, a first substrate, and a second substrate may be formed as a configuration in which the first substrate and the second substrate are respectively provided on both surfaces of the refractive index anisotropic layer and at least one of the first substrate or the second substrate has a transparent electrode.

(Still Another Example of Embodiment of Image Display Device of Present Invention)

Figure 6:
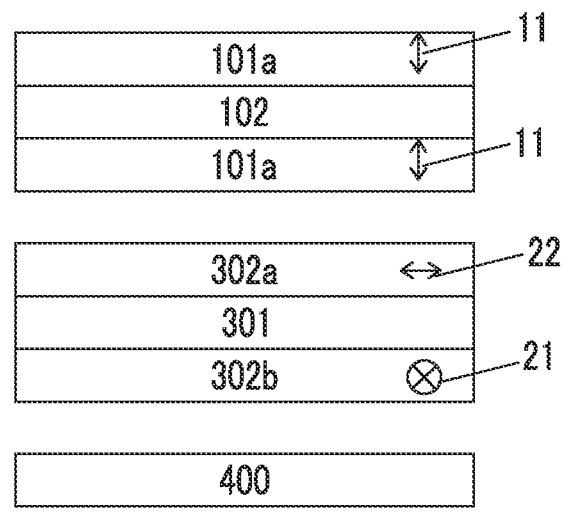
FIG. 6 is a schematic view illustrating even still another example of an image display device including an optical laminate of the present invention.

As illustrated in FIG. 6, an image display device shielding oblique light in all azimuths and capable of controlling the viewing angle can be realized by providing an optical laminate according to the embodiment of the present invention, which is obtained by laminating the (optically rotatory) refractive index anisotropic layer 102 having a 90° twisted structure between two sheets of the light absorption anisotropic layers 101a each having the absorption axis 11 in the normal direction of the film, on a viewing side of the liquid crystal panel 300 of the liquid crystal display (such as IPS, VA, or TN) formed of the surface light source 400 and the liquid crystal panel 300 that includes the liquid crystal cell 301, and the polarizing plates 302a and 302b of crossed nicols disposed on the upper and lower surfaces of the liquid crystal cell 301.

(Still Another Example of Embodiment of Optical Laminate According to Present Invention)

An optical laminate according to the embodiment of the present invention may be formed such that a light absorption anisotropic layer (polarizer layer) in which the liquid crystal compound and the dichroic substance are aligned horizontally to the film surface is laminated on one or both of the first light absorption anisotropic layer and the second light absorption anisotropic layer.

With such a configuration, a polarizer layer can be used as a polarizer in a liquid crystal panel. Further, the polarizer layer can also be used as an antireflection polarizer of an organic EL display device, a micro LED display device, or the like. In this manner, an image display device capable of controlling the viewing angle to shield oblique light in all azimuths can be formed.

Further, in a case where the optical laminate is used by being combined with the image display device, and the image display device includes a polarizer (polarizing plate) such as a liquid crystal display, the polarizer of the image display device may be used as the polarizer layer.

(Another Example of Embodiment of Optical Laminate and Image Display Device of Present Invention)

Figure 7:
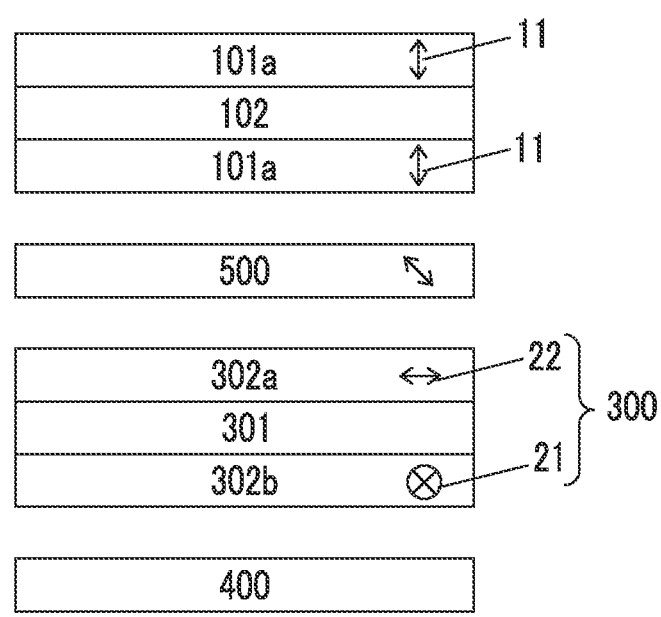
FIG. 7 is a schematic view illustrating even still another example of an image display device including an optical laminate of the present invention.

In the example illustrated in FIG. 7, an optical laminate according to the embodiment of the present invention, which is obtained by laminating the (optically rotatory) refractive index anisotropic layer 102 having a 90° twisted structure between two sheets of the light absorption anisotropic layers 101a each having the absorption axis 11 in the normal direction of the film, and a retardation layer 500 disposed between the optical laminate and the liquid crystal panel 300 are provided on a viewing side of the liquid crystal panel 300 of the liquid crystal display (such as IPS, VA, or TN) formed of the surface light source 400 and the liquid crystal panel 300 that includes the liquid crystal cell 301, and the polarizing plates 302a and 302b of crossed nicols disposed on the upper and lower surfaces of the liquid crystal cell 301. That is, in the example illustrated in FIG. 7, the optical laminate, the retardation layer, and the polarizer are provided in this order.

In a case where the optical laminate is combined with the polarizer, this causes a constant light-shielded state in a certain azimuth direction. Therefore, in a case where the refractive index anisotropic layer 102 which can electrically switch between a mode in which the transmittance in an oblique direction is decreased using a liquid crystal layer capable of electrically controlling the birefringence and a wide viewing angle mode in which the transmittance in the front direction and an oblique direction is high is used as the refractive index anisotropic layer, this causes a light-shielded state in a certain azimuth direction even in the wide viewing angle mode.

On the contrary, it is possible to suppress a constant light-shielded state from being caused in a certain azimuth direction and to increase the transmittance in oblique directions in all azimuths in the wide viewing angle mode, by providing a retardation layer between the optical laminate and the polarizer.

A typical λ/4 retardation plate or an O plate having a slow axis tilted with respect to the film surface can be suitably used as the retardation layer.

Hereinafter, optical members that can be used in the optical laminate and the image display device according to the embodiment of the present invention will be described in detail.

(Light Absorption Anisotropic Layer)

The first light absorption anisotropic layer and the second light absorption anisotropic layer (hereinafter, collectively referred to as the light absorption anisotropic layer) in the present invention each have an absorption axis that is aligned in a direction at an angle of 60° or greater and 90° or less with respect to a film surface. The direction of the absorption axis of the light absorption anisotropic layer substantially coincides with a direction in which the transmittance of the image display device is highest.

For example, in a case where the viewing angle control system is used to prevent peeping into an image display device, it is preferable to maximize the transmittance in the front direction. In this case, the absorption axis of the light absorption anisotropic layer may be aligned to coincide with the normal direction of the film and to be perpendicular to the film surface. From the viewpoint of maximizing the transmittance in the front direction, it is preferable that the absorption axis of the light absorption anisotropic layer is aligned at an angle of 80° to 90° with respect to the film surface.

Further, the absorption axis of the light absorption anisotropic layer may be set to be in different directions depending on the location. For example, in an in-vehicle display having a curved display surface, it is preferable that the direction of the absorption axis of the light absorption anisotropic layer is adjusted according to the curved surface in order to prevent light emitted from any position from being reflected on the windshield or the like and to allow the driver to appropriately visually recognize the displayed image.

The light absorption anisotropic layer in the present invention can have a light absorption anisotropic layer in which at least one dichroic substance (coloring agent) is aligned perpendicular to the film surface. The light absorption anisotropic layer can also contain a plurality of kinds of dichroic substances. For example, it is preferable that the light absorption anisotropic layer contains a cyan coloring agent exhibiting a dichroic property in a wavelength range of a red color, a magenta coloring agent exhibiting the dichroic property in a wavelength range of a green color, and a yellow coloring agent exhibiting the dichroic property in a wavelength range of a blue color. In a case where the light absorption anisotropic layer contains a plurality of kinds of dichroic substances, the tint can be made neutral and the viewing angle control effect can be exhibited over the entire wavelength range of visible light.

Further, the dichroic substance is a substance exhibiting the dichroic property, and the dichroic property denotes a property in which the absorbance varies depending on the polarization direction.

The degree of alignment of the dichroic substance at a wavelength of 550 nm is preferably 0.95 or greater. In a case where the degree of alignment of the dichroic substance is 0.95 or greater, the transmittance in the direction of the absorption axis (that is, the direction in which light is expected to be transmitted) can be increased. Further, from the viewpoint that the tint can be made neutral, the degree of alignment of the dichroic substance at a wavelength of 420 nm is preferably 0.93 or greater.

The thickness of the light absorption anisotropic layer is not particularly limited, but is preferably in a range of 100 to 8000 nm and more preferably in a range of 300 to 5000 nm from the viewpoint of the flexibility.

[Dichroic Substance]

The dichroic substance used in the present invention is not particularly limited as long as the dichroic substance is a substance exhibiting the dichroic property, and examples thereof include a dichroic coloring agent, a dichroic azo compound, an ultraviolet absorbing substance, an infrared absorbing substance, a nonlinear optical substance, carbon nanotubes, anisotropic metal nanoparticles, and an inorganic substance. A dichroic azo coloring agent compound is particularly preferable as the dichroic substance.

The dichroic azo coloring agent compound used in the present invention is not particularly limited, and a known dichroic azo coloring agent of the related art can be used. The dichroic azo coloring agent compound may or may not exhibit liquid crystallinity. In a case where the dichroic azo coloring agent compound exhibits liquid crystallinity, the dichroic azo coloring agent compound may exhibit any of nematic liquid crystallinity or smectic liquid crystallinity. The temperature at which the liquid crystal phase is exhibited is preferably in a range of room temperature (approximately 20° C. to 28° C.) to 300° C. and from the viewpoints of handleability and manufacturing suitability, more preferably in a range of 50° C. to 200° C.

In the present invention, from the viewpoint of further enhancing pressing resistance, it is preferable that the dichroic azo coloring agent compound contains a crosslinkable group. Specific examples of the crosslinkable group include a (meth)acryloyl group, an epoxy group, an oxetanyl group, and a styryl group. Among these, a (meth)acryloyl group is preferable.

In a case where the dichroic substance is anisotropic metal nanoparticles, it is preferable that the material of the anisotropic metal nanoparticles is at least one selected from gold, silver, copper, or aluminum.

[Liquid Crystal Compound]

The light absorption anisotropic layer can contain a liquid crystal compound. In a case where the light absorption anisotropic layer contains a liquid crystal compound, the dichroic substances can be aligned with a high degree of alignment while the precipitation of the dichroic substances is suppressed.

As the liquid crystal compound, any of a low-molecular-weight liquid crystal compound or a polymer liquid crystal compound can also be used, and it is preferable that both are used in combination. Here, the "low-molecular-weight liquid crystal compound" indicates a liquid crystal compound having no repeating units in the chemical structure. Here, "polymer liquid crystal compound" is a liquid crystal compound having a repeating unit in the chemical structure.

Any of a compound exhibiting nematic liquid crystallinity or a compound exhibiting smectic liquid crystallinity may be used as the low-molecular-weight liquid crystal compound, but a compound exhibiting smectic liquid crystallinity is preferable from the viewpoint of a high alignment degree. Examples thereof include the liquid crystal compounds described in JP2013-228706A.

Examples of the polymer liquid crystal compound include thermotropic liquid crystal polymers described in JP2011-237513A. Further, from the viewpoint of enhancing the strength (particularly, the bending resistance of the film), it is preferable that the polymer liquid crystal compound has a repeating unit containing a crosslinkable group at the terminal. Examples of the crosslinkable group include the polymerizable groups described in paragraphs [0040] to [0050] of JP2010-244038A. Among these, from the viewpoint of improving the reactivity and the synthetic suitability, an acryloyl group, a methacryloyl group, an epoxy group, an oxetanyl group, and a styryl group are preferable, and an acryloyl group and a methacryloyl group are more preferable.

In a case where the light absorption anisotropic layer contains a polymer liquid crystal compound, it is preferable that the polymer liquid crystal compound forms a nematic liquid crystal phase. The temperature at which the nematic liquid crystal phase is exhibited is preferably in a range of room temperature (23° C.) to 450° C. and more preferably in a range of 50° C. to 400° C. from the viewpoints of handleability and manufacturing suitability.

The content of the liquid crystal compound in the light absorption anisotropic layer is preferably in a range of 25 to 2000 parts by mass, more preferably in a range of 100 to 1300 parts by mass, and still more preferably in a range of 200 to 900 parts by mass with respect to 100 parts by mass of the content of the dichroic substances. In a case where the content of the liquid crystal compound is in the above-described ranges, the degree of alignment of the dichroic substance is further improved.

The liquid crystal composition may contain only one or two or more kinds of liquid crystal compounds. In a case where the liquid crystal composition contains two or more kinds of liquid crystal compounds, the content of the liquid crystal compounds denotes the total content of the liquid crystal compounds.

[Additive]

The light absorption anisotropic layer may further contain additives such as a solvent, a vertical alignment agent, an interface improver, a leveling agent, a polymerizable component, a polymerization initiator (for example, a radical polymerization initiator), and a durability improver. Known additives can be appropriately used as the additives.

[Base Material Layer]

The light absorption anisotropic layer may include a base material layer.

The base material layer is not particularly limited, but a transparent film or a transparent sheet is preferable, and examples thereof include known transparent resin films, transparent resin plates, transparent resin sheets, and glass. Examples of the transparent resin films include a cellulose acylate film (such as a cellulose triacetate film, a cellulose diacetate film, a cellulose acetate butyrate film, and a cellulose acetate propionate film), a polyethylene terephthalate film, a polyether sulfone film, a polyacrylic resin film, a polyurethane-based resin film, a polyester film, a polycarbonate film, a polysulfone film, a polyether film, a polymethylpentene film, a polyether ketone film, and a (meth) acrylonitrile film.

Among these, a cellulose acylate film which is highly transparent, has a small optical birefringence, is easily produced, and is typically used as a protective film of a polarizing plate is preferable, and a cellulose triacetate film is particularly preferable.

The thickness of the transparent base material film is preferably in a range of 20 μm to 100 μm.

[Alignment Film]

The light absorption anisotropic layer may have an alignment film between the base material layer and the light absorption anisotropic layer.

The alignment film may be any layer as long as the dichroic substance (liquid crystal compound) can be in a desired alignment state on the alignment film.

For example, a film formed of a polyfunctional acrylate compound or polyvinyl alcohol may be used. Polyvinyl alcohol is particularly preferable.

The absorption axis can be inclined with respect to the normal direction of the film by irradiating a photo-alignment film such as an azo compound or a cinnamoyl compound with UV rays in an oblique direction.

[Barrier Layer]

It is preferable that the optically anisotropic layer includes a barrier layer.

Here, the barrier layer is also referred to as a gas blocking layer (oxygen blocking layer) and has a function of protecting the light absorption anisotropic layer from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Refractive Index Adjusting Layer]

In the light absorption anisotropic layer, the above-described light absorption anisotropic layer contains a dichroic substance, and internal reflection due to the high refractive index of the light absorption anisotropic layer may be a problem. In that case, it is preferable that the refractive index adjusting layer is present in the optical laminate. The refractive index adjusting layer is a refractive index adjusting layer that is disposed to be in contact with the light absorption anisotropic layer and performs so-called index matching, and the in-plane average refractive index at a wavelength of 550 nm is preferably 1.55 or greater and 1.70 or less.

[Method of Forming Light Absorption Anisotropic Layer]

A method of forming the light absorption anisotropic layer is not particularly limited, and examples thereof include a method of sequentially performing a step of applying a composition for forming a light absorption anisotropic layer to form a coating film (hereinafter, also referred to as "coating film forming step") and a step of aligning the liquid crystal component and the dichroic substance contained in the coating film (hereinafter, also referred to as "aligning step").

Further, the liquid crystal component is a component that also includes a dichroic substance having liquid crystallinity in a case where the above-described dichroic substance has liquid crystallinity, in addition to the above-described liquid crystal compound.

[Coating Film Forming Step]

The coating film forming step is a step of applying a composition for forming a light absorption anisotropic layer to form a coating film.

The composition for forming a light absorption anisotropic layer can be easily applied by using the composition for forming a light absorption anisotropic layer which contains a solvent or using a liquid such as a melt obtained by heating the composition for forming a light absorption anisotropic layer.

Examples of the method of applying the composition for forming a light absorption anisotropic layer include known methods such as a roll coating method, a gravure printing method, a spin coating method, a wire bar coating method, an extrusion coating method, a direct gravure coating method, a reverse gravure coating method, a die-coating method, a spraying method, and an ink jet method.

[Aligning Step]

The aligning step is a step of aligning the liquid crystal component contained in the coating film. In this manner, a light absorption anisotropic layer is obtained.

The aligning step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystal component contained in the composition for forming a light absorption anisotropic layer may be aligned by the coating film forming step or the drying treatment described above. For example, in an aspect in which the composition for forming a light absorption anisotropic layer is prepared as a coating solution containing a solvent, a coating film having light absorption anisotropy (that is, a light absorption anisotropic film) is obtained by drying the coating film and removing the solvent from the coating film.

In a case where the drying treatment is performed at a temperature higher than or equal to the transition temperature of the liquid crystal component contained in the coating film from a liquid crystal phase to an isotropic phase, the heat treatment described below may not be performed.

The transition temperature of the liquid crystal component contained in the coating film from a liquid crystal phase to an isotropic phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case where the coating film is heated until the phase transition to the isotropic phase is made for the purpose of suppressing alignment defects and waste of heat energy and deformation and deterioration of the substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic film.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal component contained in the coating film can be fixed. The cooling means is not particularly limited and can be performed according to a known method.

[Other Steps]

The method of forming the light absorption anisotropic layer may include a step of curing the light absorption anisotropic layer after the aligning step (hereinafter, also referred to as a "curing step").

The curing step is performed by heating the light absorption anisotropic layer and/or irradiating the layer with light (exposing the layer to light), for example, in a case where the light absorption anisotropic layer contains a crosslinkable group (polymerizable group). From the viewpoint of the productivity, it is preferable that the curing step is performed by light irradiation.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

In a case where the exposure is performed while the film is heated, the heating temperature during the exposure depends on the transition temperature of the liquid crystal component contained in the liquid crystal film, but is preferably in a range of 250 to 140° C.

Further, the exposure may be performed under a nitrogen atmosphere. In a case where the curing of the liquid crystal film proceeds by radical polymerization, from the viewpoint of reducing inhibition of polymerization by oxygen, it is preferable that exposure is performed in a nitrogen atmosphere.

(Another Form of Light Absorption Anisotropic Layer Having Absorption Axis in Vertical Direction)

The light absorption anisotropic layer may be a layer that contains a dichroic coloring agent and a guest-host liquid crystal material and can electrically drive the alignment direction of the dichroic coloring agent, as described in, for example, JP2013-541727A. In this case, a state in which the viewing angle is controlled and a state in which the viewing angle is not limited can be electrically switched to each other, which is preferable. Further, the above-described case is also preferable from the viewpoint that the direction of the absorption axis of the dichroic coloring agent can be electrically controlled.

(Refractive Index Anisotropic Layer)

The refractive index anisotropic layer in the present invention is provided between two light absorption anisotropic layers. The refractive index anisotropic layer is formed of one layer or two or more layers, but in the present invention, it is preferable that the refractive index anisotropic layer is formed of one or two layers. From the viewpoint of reducing the thickness of the optical laminate or the image display device, it is preferable that the thickness of the refractive index anisotropic layer is small as long as the optical characteristics, the mechanical properties, and the manufacturing suitability are not impaired, and specifically, the thickness thereof is preferably in a range of 1 to 150 µm, more preferably in a range of 1 to 70 µm, and still more preferably in a range of 1 to 30 km.

From the viewpoint of ease of production, it is preferable that the refractive index anisotropic layer having a twisted structure is a film having a twisted structure formed by adding a chiral material to a rod-like or disk-like liquid crystal compound. Further, from the viewpoint of reducing the thickness, the refractive index anisotropic layer can be prepared to be thinner than the retardation layer formed of a polymer. Meanwhile, it is difficult to use a polymer film from the viewpoint of production because a plurality of polymer films are bonded to each other by gradually changing the angles of the slow axes of the polymer films in the plane in order to obtain the twisted structure and the optically rotatory property. As the polymer film, a cellulose acylate-based film, a cycloolefin-based polymer film (a polymer film formed of a cycloolefin-based polymer), a polycarbonate-based polymer film, a polystyrene-based polymer film, or an acrylic polymer film is preferable. It is preferable that the acrylic polymer film contains an acrylic polymer having at least one unit selected from a lactone ring unit, a maleic acid anhydride unit, or a glutaric anhydride unit.

[Refractive Index Anisotropic Layer Formed of Liquid Crystal Compound]

As the refractive index anisotropic layer formed of a liquid crystal compound, a film fixed in a state in which the liquid crystal compound is twistedly aligned is preferable. Among such films, a film obtained by applying a composition containing a liquid crystal compound that contains a polymerizable group to form a coating film, aligning the liquid crystal compound in the coating film, performing a curing treatment on the coating film, and fixing the alignment of the liquid crystal compound is more preferable.

Examples of the liquid crystal compound include a rod-like liquid crystal compound and a disk-like liquid crystal compound, and it is preferable that the liquid crystal compound contains a polymerizable group for fixing the alignment state. Further, the alignment of the liquid crystal compound at a desired twisted angle can be realized by adjusting the addition amount of the chiral agent. Further, the retardation layer formed of a liquid crystal compound is advantageous for reducing the thickness, and the thickness thereof is also easily set to 10 µm or less.

<Liquid Crystal Compound>

Examples of the liquid crystal compound include a rod-like liquid crystal compound and a disk-like liquid crystal compound.

Preferred examples of the rod-like liquid crystal compound include azomethines, azoxys, cyanobiphenyls, cyanophenyl esters, benzoic acid esters, cyclohexanecarboxylic acid phenyl esters, cyanophenyl cyclohexanes, cyano-substituted phenyl pyrimidines, alkoxy-substituted phenyl pyrimidines, phenyldioxane, tolanes, and alkenyl cyclohexyl benzonitriles. High-molecular-weight liquid crystal molecules as well as such low-molecular-weight liquid crystal molecules can also be used.

It is more preferable that the alignment of the rod-like liquid crystal compound is fixed by polymerization, and compounds described in Makromol. Chem., Vol. 190, p. 2255 (1989), Advanced Materials, Vol. 5, p. 107 (1993), U.S. Pat. Nos. 4,683,327A, 5,622,648A, 5,770,107A, WO95/22586A, WO95/24455A, WO97/00600A, WO98/23580A, WO98/52905A, JP1989-272551A (JP-H1-272551A), JP1994-16616A (JP-H6-16616A), JP1995-110469A (JP-H7-110469A), JP1999-80081A (JP-H11-80081A), and JP2001-64627 can be used as polymerizable rod-like liquid crystal compounds. Further, for example, compounds described in JP1999-513019A (JP-H11-513019A) or JP2007-279688A can also be preferably used as the rod-like liquid crystal compounds.

For example, compounds described in JP2007-108732A or JP2010-244038A can be preferably used as disk-like liquid crystal compounds, but the present invention not limited thereto.

Hereinafter, preferred examples of the disk-like liquid crystal compounds are shown below, but the present invention is not limited thereto.

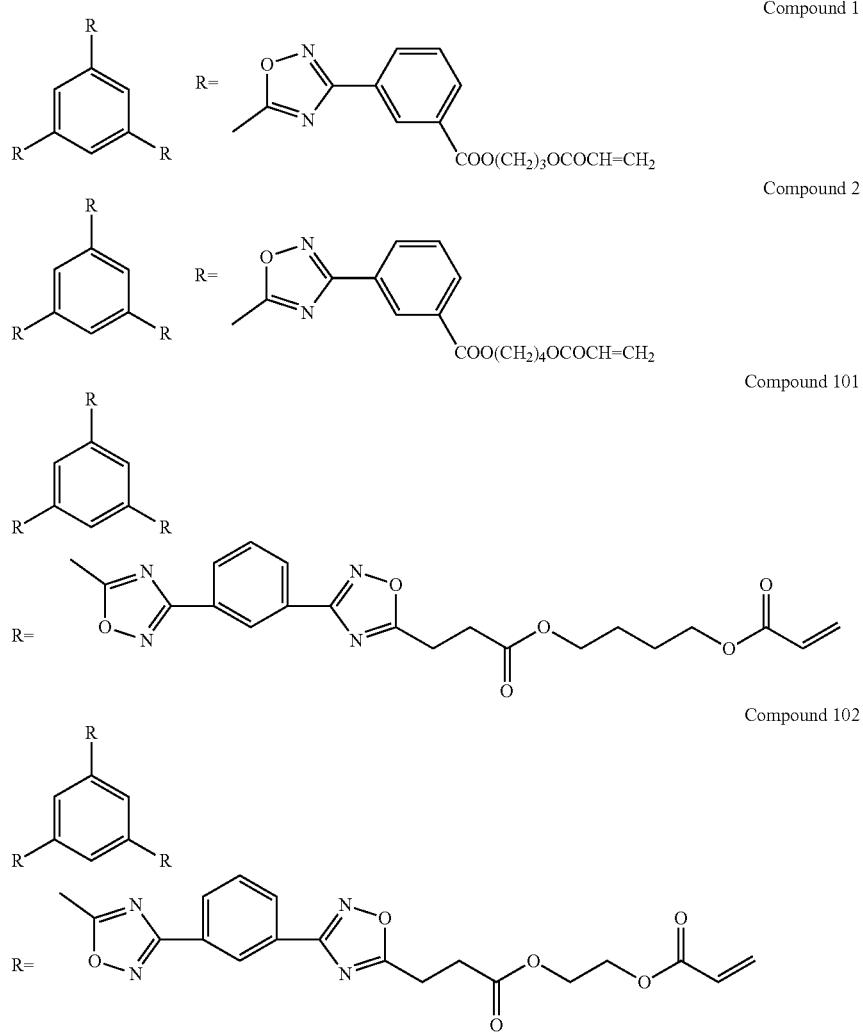

<Chiral Agent>

The chiral agent is a compound for adjusting the spiral period of the cholesteric liquid crystal compound. In the present invention, various known chiral agents (for example, Liquid Crystal Device Handbook, Chapter 3, Section 4-3, TN, chiral agent for STN, p. 199, edited by Japan Society for the Promotion of Science, 42nd Committee, 1989) can be used. The chiral agent typically contains asymmetric carbon atoms, but an axially asymmetric compound or planarly asymmetric compound that does not contain asymmetric carbon atoms can also be used as a chiral agent. Examples of the axially asymmetric compound and the planarly asymmetric compound include binaphthyl, helicene, paracyclophane, and derivatives thereof. The chiral agent may contain a polymerizable group. In a case where the chiral agent contains a polymerizable group and the rod-like liquid crystal compound used in combination also contains a polymerizable group, a polymer having a repeating unit derived from the rod-like liquid crystal compound and a repeating unit derived from the chiral agent can be formed by the polymerization reaction between the chiral agent containing a polymerizable group and the polymerizable rod-like liquid crystal compound. In this aspect, it is preferable that the polymerizable group contained in the chiral agent containing a polymerizable group is the same group as the polymerizable group contained in the polymerizable rod-like liquid crystal compound. Therefore, as the polymerizable group of the chiral agent, an unsaturated polymerizable group, an epoxy group, or an aziridinyl group is preferable, an unsaturated polymerizable group is more preferable, and an ethylenically unsaturated polymerizable group is particularly preferable.

Further, the chiral agent described above may be a liquid crystal compound.

Examples of the chiral agent exhibiting a strong twisting force include chiral agents described in JP2010-181852A, JP2003-287623A, JP2002-80851A, JP2002-80478A, and JP2002-302487A, which can be preferably used in the present invention. Further, isosorbide compounds having a corresponding structure can be used for the isosorbide compounds described in these publications, and isomannide compounds having a corresponding structure can be used for the isomannide compounds described in these publications.

It is also preferable to use a liquid crystal compound exhibiting a wavelength dispersibility of reverse dispersion as the liquid crystal compound. Examples thereof include the liquid crystal compound exhibiting the wavelength dispersibility of reverse dispersion described in the pamphlet of WO2017/043438A. The refractive index anisotropic layer (retardation layer) formed of the liquid crystal compound exhibiting the wavelength dispersibility of reverse dispersion can perform optical compensation over the entire wavelength range of visible light in the viewing angle control system.

Here, the wavelength dispersibility of reverse dispersion denotes that the values of the Re (λ) and the Rth (λ) increase as the wavelength λ increases.

In a case where the refractive index anisotropic layer is a retardation film formed of a liquid crystal compound, the refractive index anisotropic layer may have an alignment film. The alignment film typically contains a polymer as a main component. The polymer material for the alignment film is described in multiple documents, and multiple commercially available products can be obtained. As the polymer material to be used, polyvinyl alcohol or polyimide and derivatives thereof are preferable. Modified or unmodified polyvinyl alcohol is particularly preferable. As the alignment film that can be used in the present invention, the modified polyvinyl alcohols and the like described from the 24th line on page 43 to the 8th line on page 49 of WO01/88574A1 and paragraphs [0071] to [0095] of JP3907735B can be referred to. Further, the above-described alignment film is typically subjected to a known rubbing treatment.

From the viewpoint of imparting the alignment ability for forming a refractive index anisotropic layer and relaxing the surface unevenness of the film to form a refractive index anisotropic layer having a uniform film thickness, it is preferable that the thickness of the alignment film is small, but the alignment film is required to have a certain thickness. Specifically, the thickness of the alignment film is preferably in a range of 0.01 to 10 μm, more preferably in a range of 0.01 to 1 μm, and still more preferably in a range of 0.01 to 0.5 μm.

In the present invention, it is also preferable that a photo-alignment film is used. Although the photo-alignment film is not particularly limited, those described in paragraphs [0024] to [0043] of WO2005/096041A and LPP-JP265CP (trade name, manufactured by Rolic Technologies Ltd.) can be suitably used.

[Refractive Index Anisotropic Layer Formed of Polymer Film]

In a case where a retardation layer obtained by stretching a polymer film is used as the refractive index anisotropic layer, the refractive index anisotropic layer is obtained, for example, by performing a stretching treatment using a machine-direction stretching method by controlling the circumferential speed of a roll, a cross-direction stretching method with a tenter, or a biaxial stretching method, on the polymer film (for example, a cellulose acylate film, a cyclic polyolefin film, a polycarbonate film, a polystyrene film, or a copolymer containing methyl methacrylate, styrene, and maleic acid anhydride) produced by an appropriate method such as a melt film forming method or a solution film forming method. Specifically, the description in JP2005-338767A can be referred to.

Further, for example, the refractive index anisotropic layer can also be prepared by a method of bonding a shrinkable film to one or both surfaces of the polymer film and heating and stretching the film to be stretched in the thickness (nz) direction as described in JP1993-157911A (JP-H5-157911A), JP2006-72309A, or JP2007-298960A.

The polymer film can be suitably used, for example, to prepare a B-plate. It is preferable to use a polymer film exhibiting negative intrinsic birefringence in order to prepare a refractive index anisotropic layer having a negative Nz coefficient, and for example, a film or the like formed of a blend of a copolymer of methyl methacrylate-methyl acrylate and a styrene-maleic acid anhydride copolymer, described in Example 19 of JP2008-262182A, can be used.

As the polymer film, it is also preferable to use a polymer film exhibiting wavelength dispersibility of reverse dispersion. As the polymer film exhibiting wavelength dispersibility of reverse dispersion, for example, a modified polycarbonate film is known.

(Refractive Index Anisotropic Layer that can be Electrically Controlled)

In a case where the refractive index anisotropic layer is a liquid crystal cell, it is preferable that the liquid crystal cell is in a twisted nematic (TN) mode having a twisted structure, but the present invention is not limited thereto, and the present inventors found that the effects of the present invention can be obtained even in a super twisted nematic (STN) mode having a twisted angle of 1800 or greater. In the liquid crystal cell in a TN mode, rod-like liquid crystal molecules are substantially horizontally aligned at the time of no voltage application and further twistedly aligned at 60° to 120°. Meanwhile, the present inventors found that the viewing angle of the present invention can be satisfactorily controlled by using a liquid crystal in a vertically aligned twisted nematic (VATN) mode in which the liquid crystal layer is twistedly aligned at 60° to 120° in a state where the rod-like liquid crystal molecules are substantially vertically aligned at the time of no voltage application and the voltage has been applied, as disclosed in JP1998-123576A (JP-H10-123576A).

(Optical Laminate)

The optical laminate according to the embodiment of the present invention is realized by combining two light absorption anisotropic layers and a refractive index anisotropic layer (FIG. 2). In typical liquid crystal display devices and organic EL display devices, a polarizing plate having an absorption axis in the in-plane direction of the display surface is laminated in many cases. Therefore, the optical laminate according to the embodiment of the present invention is highly convenient from the viewpoint that the optical laminate can be subsequently bonded to the polarizing plate that has been already bonded to a liquid crystal display device or an organic EL display device to prepare the image display device according to the embodiment of the present invention.

(Polarizer Layer)

As the polarizer layer in the present invention, a polarizer in which a typical dichroic substance having an absorption axis whose direction is a direction horizontal to the film surface is horizontally aligned can be used. For example, a polarizer in which a dichroic substance is horizontally aligned by dyeing and stretching the dichroic substance on polyvinyl alcohol or another polymer resin or a polarizer in which a dichroic substance is horizontally aligned by applying alignment of a liquid crystal compound as in a case of the light absorption anisotropic layer of the present invention may be employed.

A polarizer obtained by stretching polyvinyl alcohol and dyeing the polyvinyl alcohol with iodine is commonly used as a polarizer layer of a polarizing plate provided in a liquid crystal display device or an organic EL display device. Therefore, in a case where the optical laminate according to the embodiment of the present invention is used for a liquid crystal display device or an organic EL display device, the polarizing plate provided in the liquid crystal display device or the organic EL display device can also serve as a polarizer layer.

Further, the polarizer layer may be a reflective polarizer or a laminate of an absorption type polarizer (typical polarizer) and a reflective polarizer. A reflective polarizer is a polarizer that reflects one polarized light and transmits the other polarized light. Further, the reflective polarizer has a reflection axis and a transmission axis in the plane, but the reflection axis functions in the same manner as the absorption axis in a typical polarizer in terms that the reflection axis does not transmit polarized light in the azimuth, and thus the reflection axis can be read as the absorption axis in the present specification.

In a case where the polarizer layer is a reflective polarizer, since light that is not transmitted through the reflective polarizer is reflected, the reflected light is reused and thus light utilization efficiency can be increased, for example, in a case where the optical laminate is incorporated on a backlight side of a liquid crystal display device.

As the reflective polarizer, a brightness-improving film "DBEF" or "APF" (manufactured by 3M Company), a wire grid polarizing film "WGF" (manufactured by Asahi Kasei Corporation), or the like can be suitably used.

The optical laminate of the present invention includes at least a first light absorption anisotropic layer having a polarization axis in the vertical direction, a refractive index anisotropic layer, and a second light absorption anisotropic layer having a polarization axis in the vertical direction, but may further include other functional layers. Examples of other functional layers can include a pressure sensitive adhesive layer, an adhesive layer, an antireflection layer, and a protective layer.

A method of producing the optical laminate may include a step of respectively preparing the light absorption anisotropic layer, the refractive index anisotropic layer, and other functional layers and bonding these with a pressure sensitive adhesive or an adhesive.

Further, the method may include, for example, a step of transferring the light absorption anisotropic layer formed on a base material to the refractive index anisotropic layer.

Further, the method may also include a step of preparing the refractive index anisotropic layer by directly coating the light absorption anisotropic layer with the refractive index anisotropic layer and a step of directly forming the light absorption anisotropic layer on the refractive index anisotropic layer after the formation of the refractive index anisotropic layer.

Each step can be carried out by a known method and the present invention is not particularly limited thereto.

(Image Display Device)

The optical laminate according to the embodiment of the present invention can be used for an optional image display device.

The image display device is not particularly limited, and examples thereof include a liquid crystal display device, an organic EL display device, a micro LED display device, a head-up display, and a head-mounted display.

As illustrated in FIG. 4, a liquid crystal display device typically includes a liquid crystal cell 301 and a backlight 400, and polarizing plates (302a and 302b) are provided on both surfaces of the liquid crystal cell 301 on the viewing side and the backlight side. The optical laminate according to the embodiment of the present invention can be applied to any one surface of the liquid crystal panel 300 on the viewing side (FIG. 6) or the backlight side (FIG. 4), or can be applied to both surfaces thereof (not illustrated). Further, the optical laminate according to the embodiment of the present invention can be applied by being bonded to the polarizing plate on one or both surfaces of the liquid crystal panel 300.

In a case where the optical laminate according to the embodiment of the present invention is applied to the liquid crystal display device, it is preferable that the optical laminate is disposed on the backlight side of the liquid crystal cell from the viewpoint of enhancing the display performance of the liquid crystal display device. Further, in a case where the optical laminate according to the embodiment of the present invention is applied to the backlight side of the liquid crystal cell, it is preferable that the polarizer layer of the liquid crystal cell is a reflective polarizer or a laminate of a typical polarizer and a reflective polarizer from the viewpoint of enhancing the light utilization efficiency.

Some image display devices are thin and can be molded into a curved surface. The optical laminate according to the embodiment of the present invention is thin and easily bent and thus can be suitably applied to an image display device having a curved display surface.

Further, some image display devices have a pixel density of greater than 250 ppi and are capable of high-definition display. The optical laminate according to the embodiment of the present invention can be suitably applied to such a high-definition image display device without causing moire.

[Liquid Crystal Cell for Display Device]

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules are substantially horizontally aligned at the time of no voltage application and further twistedly aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystal molecules are substantially vertically aligned at the time of no voltage application. The concept of the liquid crystal cell in a VA mode includes (1) a liquid crystal cell in a VA mode in a narrow sense where rod-like liquid crystal molecules are aligned substantially vertically at the time of no voltage application and substantially horizontally at the time of voltage application (described in JP1990-176625A (JP-H2-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, or a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, an aspect of a display device including the above-described optical laminate according to the embodiment of the present invention, a λ/4 plate, and an organic EL display panel in this order from the viewing side is suitably exemplified.

Further, the organic EL display panel is a display panel formed using an organic EL element having an organic light emitting layer (organic electroluminescence layer) interposed between electrodes (between a cathode and an anode). The configuration of the organic EL display panel is not particularly limited, and a known configuration is employed.

[Curved Image Display Device]

Examples of the curved surface image display device of the present invention include those disclosed in JP2017-181821A, JP2017-181819A, JP2017-102456A, and JP2014-95901A.

[Glass Composite]

The optical laminate according to the embodiment of the present invention can be combined with glass.

For example, it is possible to prevent peeping into the display device by disposing the optical laminate according to the embodiment of the present invention on a window glass surface. Further, the sunshine can be controlled and the power consumption of an air conditioner can be reduced in summer by disposing the optical laminate according to the embodiment of the present invention on a glass surface on which sunlight is incident. Further, the same effects can be obtained even in a case where the optical laminate is applied to an in-vehicle window.

Further, the glass composite may be a laminated glass having an interlayer between two sheets of plate glasses, and the interlayer may be configured to include the optical laminate according to the embodiment of the present invention.

EXAMPLES

Hereinafter, the present invention will be described in more detail based on the following examples. The materials, the reagents, the amounts of substances and the proportions of the substances, the operations, and the like shown in the following examples can be appropriately changed within a range not departing from the scope of the present invention. Therefore, the scope of the present invention is not limited to the following specific examples.

[Preparation of Light Absorption Anisotropic Layer]

A light absorption anisotropic layer 101a used in the examples and the comparative examples of the present invention was prepared as follows.

<Preparation of Transparent Support 1 with Alignment Film>

A surface of a cellulose acylate film (TAC base material having a thickness of 40 μm; TG40, manufactured by FUJIFILM Corporation) was saponified with an alkaline solution and coated with the following coating solution 1 for forming an alignment layer using a wire bar. The cellulose acylate film on which the coating film had been formed was dried with hot air at 60° C. for 60 seconds and further dried with hot air at 100° C. for 120 seconds to form an alignment layer PA1, thereby obtaining a transparent support 1 with an alignment layer.

The film thickness of the alignment film PA1 was 0.5 μm.

(Coating Solution 1 for Forming Alignment Layer)

Modified polyvinyl alcohol shown below: 3.80 parts by mass
Initiator Irg2959: 0.20 parts by mass
Water: 70 parts by mass
Methanol: 30 parts by mass Modified Polyvinyl Alcohol

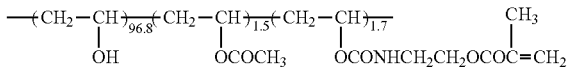

<Formation of Light Absorption Anisotropic Layer P1 of Examples 1 to 9 and Comparative Example 1>

The obtained alignment layer PA1 was continuously coated with the following composition 1 for forming a light absorption anisotropic layer with a wire bar to form a coating layer.

Next, the coating layer was heated at 140° C. for 30 seconds and cooled to room temperature (23° C.).

Next, the coating layer was heated at 80° C. for 60 seconds and cooled to room temperature again.

Thereafter, the coating layer was irradiated with an LED lamp (center wavelength of 365 nm) for 2 seconds under an irradiation condition of an illuminance of 200 mW/cm², thereby preparing a light absorption anisotropic layer P1 on the alignment layer PAL.

The film thickness of the light absorption anisotropic layer P1 was 3 μm, and the alignment degree at a wavelength of 550 nm was 0.92. The light absorption anisotropic layer P1 with the support which had been obtained above was used as a light absorption anisotropic layer 101a.

Further, the angle of the absorption axis of the light absorption anisotropic layer P1 with respect to the film surface was 90° in a case where the absorption axis was observed.

<Measurement of Alignment Angle of Light Absorption Anisotropic Layer>

The light absorption anisotropic layer prepared on a sample table was horizontally provided, P polarized light was allowed to be incident on the surface of the light absorption anisotropic layer while the azimuthal angle and the polar angle for incidence were variously changed, the transmittance thereof was measured, and the azimuthal angle and the polar angle at which the transmittance was maximized were examined using Polarimeter AxoScan OPMF-1 (manufactured by Axometrics Inc.).

Further, sections having a thickness of 2 μm were collected by a microtome in parallel with the azimuthal angle at which the transmittance was maximized and in parallel with the plane including the normal line with respect to the surface of the light absorption anisotropic layer, and the collected sections were laid down, provided on a rotation stage of a polarizing microscope, and the azimuthal angles (angles at which the sections were allowed to rotate) of the sections at which the cross section of the light absorption anisotropic layer was most extinguished with respect to the incident linearly polarized light were acquired. In this manner, the angle of the absorption axis of the light absorption anisotropic layer was measured.

(Composition 1 for Forming Light Absorption Anisotropic Layer)
Dichroic substance D-1 shown below: 0.40 parts by mass
Dichroic substance D-2 shown below: 0.15 parts by mass
Dichroic substance D-3 shown below: 0.63 parts by mass
Polymer liquid crystal compound P-1 shown below: 3.20 parts by mass
Low-molecular-weight liquid crystal compound M-1 shown below: 0.45 parts by mass
Polymerization initiator IRGACURE OXE-02 (manufactured by BASF SE): 0.040 parts by mass
Compound E-1 shown below: 0.060 parts by mass
Compound E-2 shown below: 0.060 parts by mass
Surfactant F-1 shown below: 0.010 parts by mass
Surfactant F-2 shown below: 0.015 parts by mass
Cyclopentanone: 47.00 parts by mass
Tetrahydrofuran: 47.00 parts by mass
Benzyl alcohol: 1.00 parts by mass Dichroic substance D-1

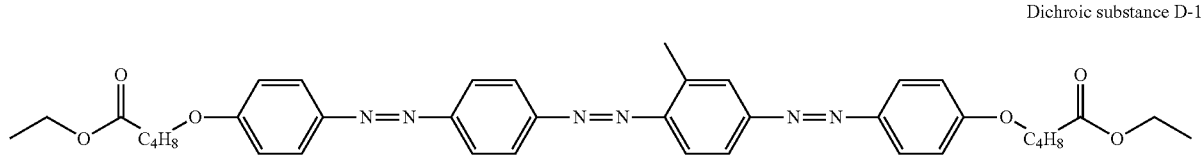

Dichroic substance D-2

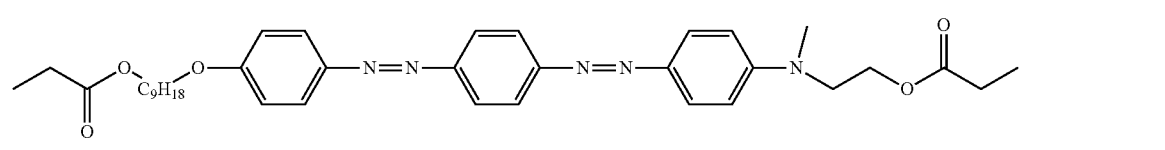

Dichroic substance D-3

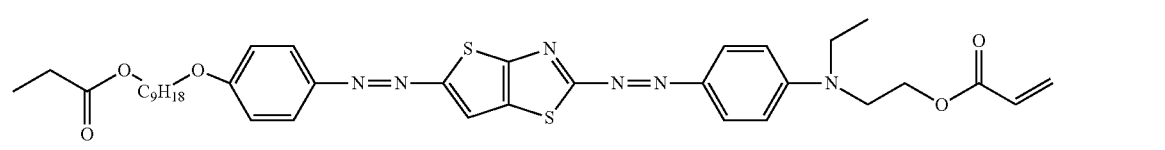

Polymer liquid crystal compound P-1

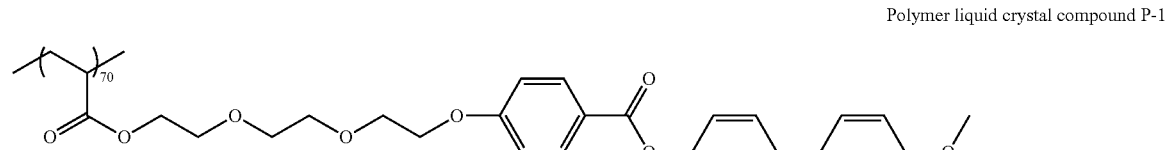

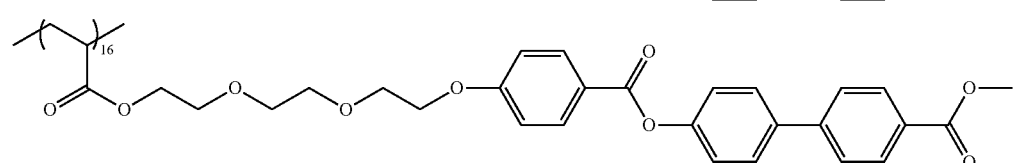

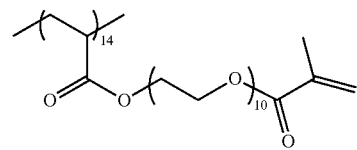

Low-molecular-weight liquid crystal compound M-1

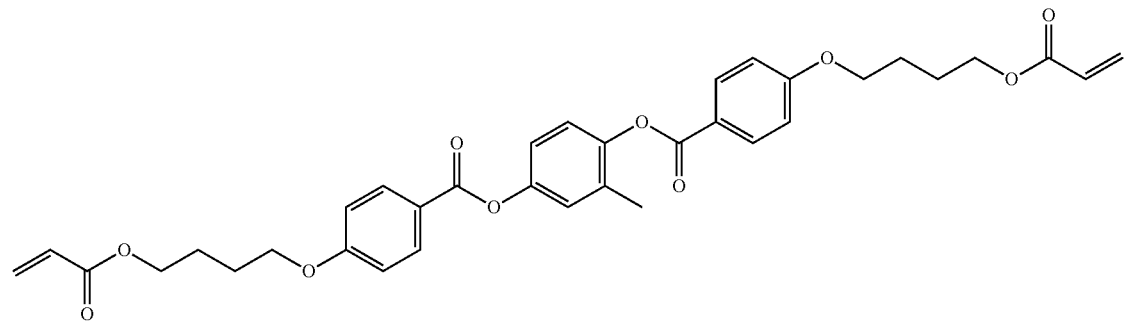

-continued

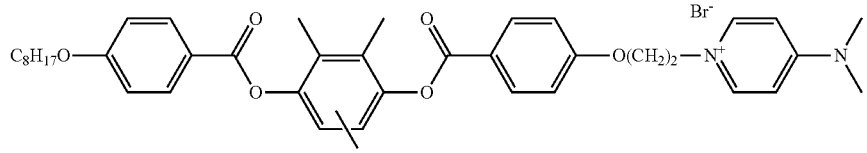

Compound E-1

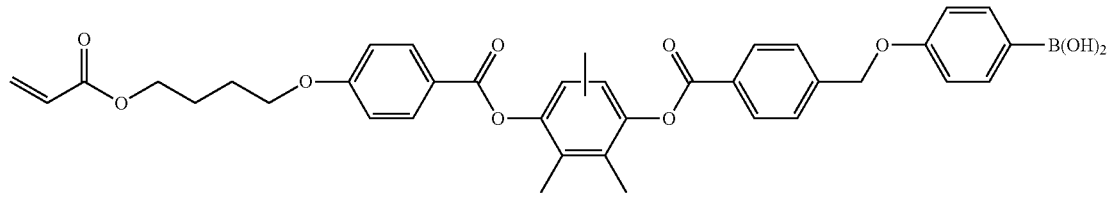

Compound E-2

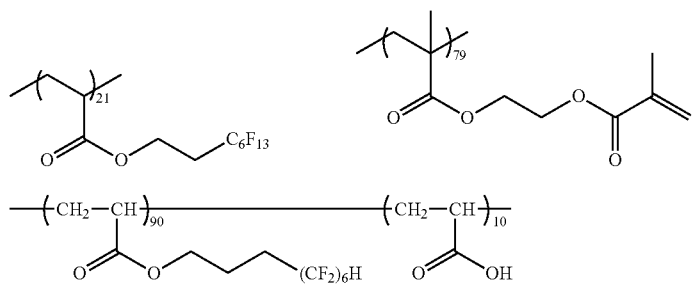

Surfactant F-1

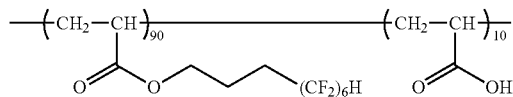

Surfactant F-2

<Preparation of Light Absorption Anisotropic Layer of Example 10>

A light absorption anisotropic layer was formed in the same manner as that for the light absorption anisotropic layer P1 except that the following composition 2 for forming a light absorption anisotropic layer was used in Example 10.

(Composition 2 for Forming Light Absorption Anisotropic Layer)

Dichroic substance D-1 shown above: 0.40 parts by mass
Dichroic substance D-2 shown above: 0.15 parts by mass
Dichroic substance D-3 shown above: 0.68 parts by mass
Polymer liquid crystal compound P-1 shown above: 3.20 parts by mass
Low-molecular-weight liquid crystal compound M-1 shown above: 0.45 parts by mass
Polymerization initiator IRGACURE OXE-02 (manufactured by BASF SE): 0.040 parts by mass
Compound E-1 shown above: 0.060 parts by mass
Compound E-2 shown above: 0.060 parts by mass
Surfactant F-1 shown above: 0.010 parts by mass
Surfactant F-2 shown above: 0.015 parts by mass
Cyclopentanone: 47.00 parts by mass
Tetrahydrofuran: 47.00 parts by mass
Benzyl alcohol: 1.00 parts by mass <Preparation of Light Absorption Anisotropic Layer of Example 11>

A light absorption anisotropic layer was formed in the same manner as that for the light absorption anisotropic layer P1 except that the following composition 3 for forming a light absorption anisotropic layer was used in Example 11.

(Composition 3 for Forming Light Absorption Anisotropic Layer)

Dichroic substance D-1 shown above: 0.40 parts by mass
Dichroic substance D-2 shown above: 0.09 parts by mass
Dichroic substance D-3 shown above: 0.69 parts by mass
Polymer liquid crystal compound P-1 shown above: 3.20 parts by mass
Low-molecular-weight liquid crystal compound M-1 shown above: 0.45 parts by mass
Polymerization initiator IRGACURE OXE-02 (manufactured by BASF SE): 0.040 parts by mass
Compound E-1 shown above: 0.060 parts by mass
Compound E-2 shown above: 0.060 parts by mass
Surfactant F-1 shown above: 0.010 parts by mass
Surfactant F-2 shown above: 0.015 parts by mass
Cyclopentanone: 47.00 parts by mass
Tetrahydrofuran: 47.00 parts by mass
Benzyl alcohol: 1.00 parts by mass <Preparation of Light Absorption Anisotropic Layer of Example 12>

A light absorption anisotropic layer was formed in the same manner as the light absorption anisotropic layer P1 except that the following composition 4 for forming a light absorption anisotropic layer was used in Example 12.

(Composition 4 for Forming Light Absorption Anisotropic Layer)

Carbon nanotubes (manufactured by FUJIFILM Wako Pure Chemical Corporation): 0.56 parts by mass
Polymer liquid crystal compound P-1 shown above: 3.20 parts by mass
Low-molecular-weight liquid crystal compound M-1 shown above: 0.45 parts by mass
Polymerization initiator IRGACURE OXE-02 (manufactured by BASF SE): 0.040 parts by mass
Compound E-1 shown below: 0.060 parts by mass
Compound E-2 shown below: 0.060 parts by mass
Surfactant F-1 shown below: 0.010 parts by mass
Surfactant F-2 shown below: 0.015 parts by mass
Cyclopentanone: 47.00 parts by mass
Tetrahydrofuran: 47.00 parts by mass
Benzyl alcohol: 1.00 parts by mass <Preparation of Light Absorption Anisotropic Layer of Example 13>

A light absorption anisotropic layer was formed in the same manner as that for the light absorption anisotropic layer P1 except that the following composition 5 for forming a light absorption anisotropic layer was used in Example 13.

(Composition 5 for Forming Light Absorption Anisotropic Layer)

Silver nanowire (manufactured by Sigma-Aldrich Co. LLC.): 0.66 parts by mass

Polymer liquid crystal compound P-1 shown above: 3.20 parts by mass

Low-molecular-weight liquid crystal compound M-1 shown above: 0.45 parts by mass Polymerization initiator IRGACURE OXE-02 (manufactured by BASF SE): 0.040 parts by mass Compound E-1 shown above: 0.060 parts by mass Compound E-2 shown above: 0.060 parts by mass Surfactant F-1 shown above: 0.010 parts by mass Surfactant F-2 shown above: 0.015 parts by mass Cyclopentanone: 47.00 parts by mass Tetrahydrofuran: 47.00 parts by mass Benzyl alcohol: 1.00 parts by mass

[Preparation of Refractive Index Anisotropic Layer]

Various retardation layers used in the examples of the present invention were prepared as follows.

<Preparation of Retardation Layer (λ/2) of Comparative Example 1>

(Extrusion molding)

A cycloolefin resin ARTON G7810 (manufactured by JSR Corporation) was dried at 100° C. for 2 hours or longer and melt-extruded at 280° C. using a twin screw kneading extruder. Here, a screen filter, a gear pump, and a leaf disc filter were disposed in this order between the extruder and the die, these were connected by a melt pipe, and the resultant was extruded from a T die having a width of 1000 mm and a lip gap of 1 mm and was cast on a triple cast roll whose temperature was set to 180° C., 175° C. and 170° C., thereby obtaining an unstretched film 1 having a width of 90° mm and a thickness of 320 μm.

(Stretching/Thermal Fixation)

The unstretched film 1 being transported was subjected to a stretching step and a thermal fixing step by the following method.

(a) Machine-Direction Stretching

The unstretched film 1 was machine-directionally stretched under the following conditions while being transported using an inter-roll machine-directional stretching machine having an aspect ratio (L/W) of 0.2.

<Conditions>

Preheating temperature: 170° C.

Stretching temperature: 170° C.

Stretching ratio: 155%

(b) Cross-Direction Stretching

The machine-directionally stretched film was cross-directionally stretched under the following conditions while being transported using a tenter.

<Conditions>

Preheating temperature: 170° C.

Stretching temperature: 170° C.

Stretching ratio: 80%

(c) Thermal Fixation

After the stretching step, the stretched film was subjected to a heat treatment under the following conditions while end portions of the stretched film were gripped with a tenter clip to hold both end portions of the stretched film such that the width thereof was constant (within 3% of expansion or contraction), and the stretched film was thermally fixed.

Thermal fixation temperature: 165° C.

Thermal fixation time: 30 seconds

Further, the preheating temperature, the stretching temperature, and the thermal fixation temperature are average values of values measured at five points in the width direction using a radiation thermometer.

(Winding)

After the thermal fixation, both ends of the stretched film were trimmed and wound at a tension of 25 kg/m, thereby obtaining a film roll having a width of 1340 mm and a winding length of 2000 μm.

The Re of the obtained stretched film was 275 nm, the Rth thereof was 192 nm, the Nz coefficient thereof was 1.2, the slow axis was in the TD direction, and the film thickness thereof was 68 μm. The obtained film was used as a λ/2 retardation layer in the comparative examples.

<Preparation of Refractive Index Anisotropic Layers of Examples 1, 2, 6 to 9, and 11 to 13>

(Preparation of Photo-Alignment Film)

A coating solution 1 for a photo-alignment film was prepared with reference to the description of Example 3 of JP2012-155308A.

One surface of a cellulose acetate film "Z-TAC" (manufactured by FUJIFILM Corporation) was coated with the coating solution 1 for a photo-alignment film which had been prepared in advance, using a bar coater. The surface thereof was coated with the coating solution and dried on a hot plate at 120° C. for 2 minutes to remove the solvent, thereby forming a coating film. The obtained coating film was irradiated with polarized ultraviolet rays (10 mJ/cm$^2$, using an ultra-high pressure mercury lamp) to form a photo-alignment film 1.

(Formation of Refractive Index Anisotropic Layer Containing Rod-Like Liquid Crystal Compound)

A composition 1 for forming a liquid crystal layer with the following composition was prepared.

The photo-alignment film 1 was coated with the composition 1 for forming a liquid crystal layer using a bar coater to form a composition layer. The formed composition layer was heated to 110° C. on a hot plate and cooled to 60° C. so that the alignment was stabilized. Thereafter, the temperature was maintained at 60° C., and the alignment was fixed by irradiating the layer with ultraviolet rays (500 mJ/cm$^2$, using an ultra-high pressure mercury lamp) under a nitrogen atmosphere (oxygen concentration of 100 ppm), thereby preparing a refractive index anisotropic layer having a thickness of 3.5 μm, and by adjusting a chiral agent, having a 90° twisted structure. The prepared refractive index anisotropic layer had Δnd of 450 nm (wavelength of 550 nm).

Further, the chiral agent was similarly adjusted to prepare an optional refractive index anisotropic layer having an angle of 450 to 3150 of another embodiment.

(Composition 1 for Forming Liquid Crystal Layer)
Liquid crystal compound R1: 84.00 parts by mass
Polymerizable compound B2: 16.00 parts by mass
Polymerization initiator P3: 0.50 parts by mass
Surfactant S3: 0.15 parts by mass
Chiral agent: 0.1 parts by mass
HISOLVE MTEM (manufactured by Toho Chemical Industry Co., Ltd.): 2.00 parts by mass
NK ESTER A-200 (manufactured by Shin-Nakamura Chemical Co., Ltd.): 1.00 parts by mass
Methyl ethyl ketone: 424.8 parts by mass sition 1 for forming a liquid crystal layer except that the following composition 2 for forming a liquid crystal layer was used.

The prepared refractive index anisotropic layer had $\Delta nd$ of 350 nm (wavelength of 550 nm).

(Composition 2 for Forming Liquid Crystal Layer)
Liquid crystal compound R2: 42.00 parts by mass
Liquid crystal compound R3: 42.00 parts by mass
Polymerizable compound B2: 16.00 parts by mass
Polymerization initiator P3: 0.50 parts by mass
Surfactant S3: 0.15 parts by mass

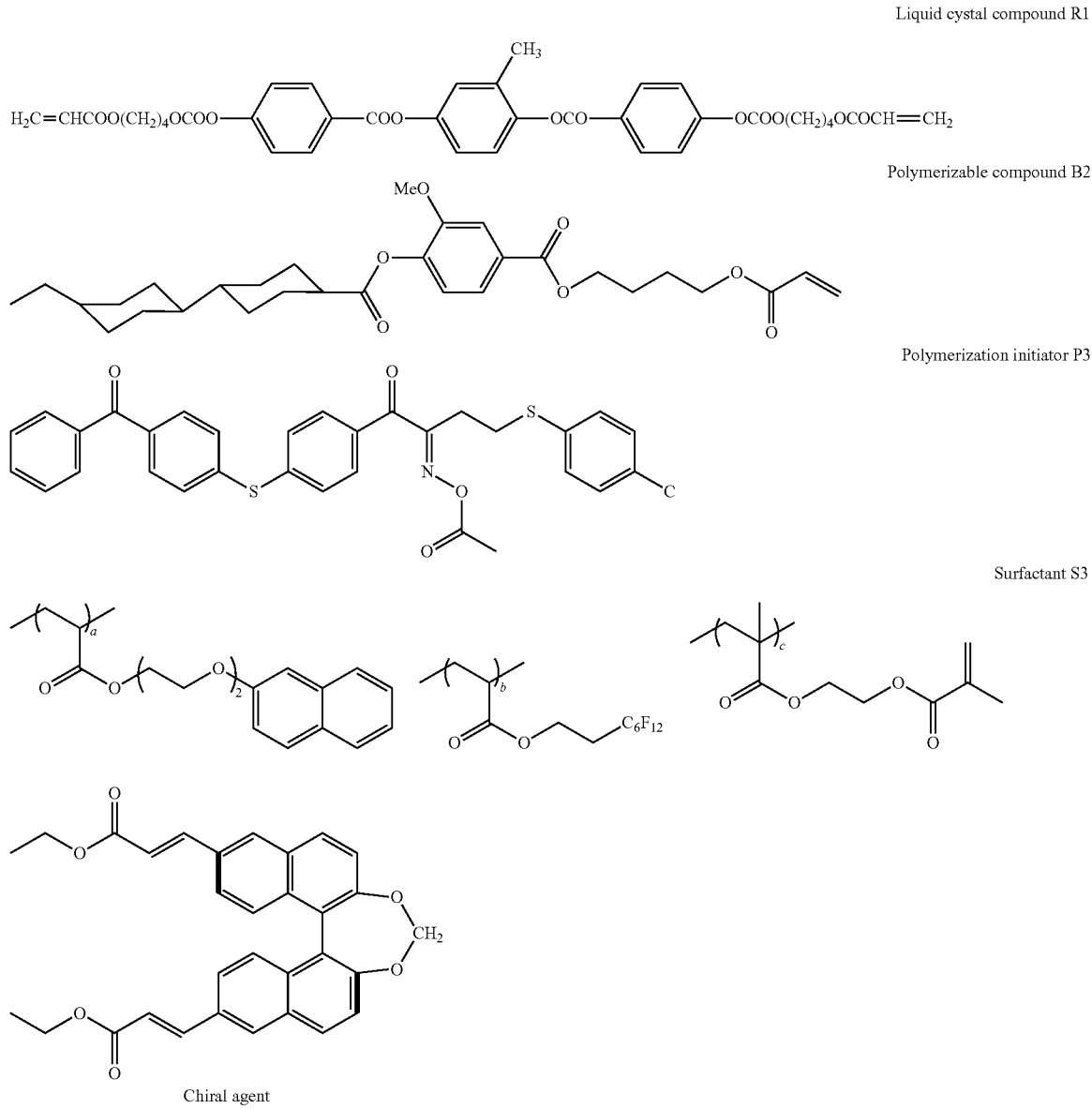

<Preparation of Refractive Index Anisotropic Layer of Example 10>
<Preparation of Refractive Index Anisotropic Layer Having Twisted Structure with Reverse Wavelength Dispersibility>

A refractive index anisotropic layer having a 90° twisted structure with reverse wavelength dispersibility was formed in the same manner as that for the above-described compo- Chiral agent: 0.1 parts by mass
HISOLVE MTEM (manufactured by Toho Chemical Industry Co., Ltd.): 2.00 parts by mass
NK ESTER A-200 (manufactured by Shin-Nakamura Chemical Co., Ltd.): 1.00 parts by mass
Methyl ethyl ketone: 424.8 parts by mass Liquid crystal compound R2

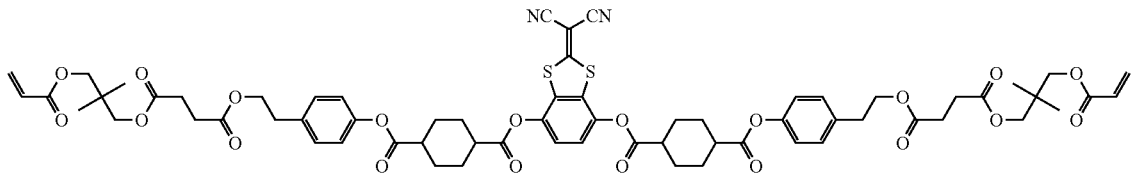

Liquid crystal compound R3

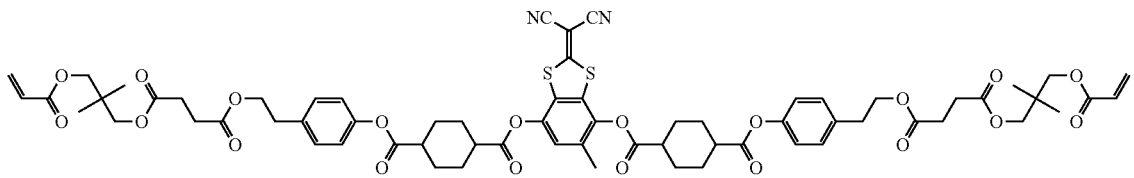

<Preparation of Refractive Index Anisotropic Layer of Example 3>

The alignment film PA1 used for preparing the light absorption anisotropic layer described above was subjected to a rubbing treatment.

The alignment film prepared above was coated with the following composition 3 for forming a liquid crystal layer containing a disk-like liquid crystal compound with the following composition, using a wire bar. Next, the film was heated with hot air at 120° C. for 90 seconds for drying the solvent of the coating solution and alignment aging of the disk-like liquid crystal compound. Subsequently, the alignment of the liquid crystal compound was fixed by performing UV irradiation at 80° C. In this manner, a refractive index anisotropic layer obtained by twisting a disk-like liquid crystal by 90° was prepared. The prepared refractive index anisotropic layer had Δnd of 350 nm (wavelength of 550 nm).

(Composition 3 for Forming Liquid Crystal Layer)
- Disk-like liquid crystal compound shown below: 91 parts by mass
- Acrylate monomer shown below: 5 parts by mass
- Photopolymerization initiator (IRGACURE 907, manufactured by Ciba-Geigy AG): 3 parts by mass
- Sensitizer (KAYACURE DETX, manufactured by Nippon Kayaku Co., Ltd.): 1 part by mass
- Pyridinium salt shown below: 0.5 parts by mass
- Chiral agent: 0.1 parts by mass
- Fluorine-based polymer (FP1) shown below: 0.2 parts by mass
- Fluorine-based polymer (FP3) shown below: 0.1 parts by mass
- Methyl ethyl ketone: 189 parts by mass Discotic liquid crystal compound

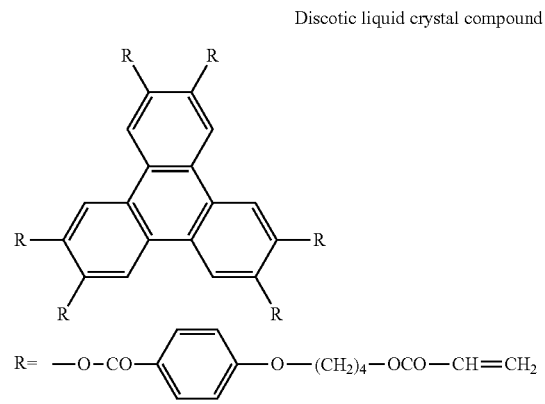

Acrylate Monomer:
Ethylene oxide-modified trimethylolpropane triacrylate (V #360, manufactured by Osaka Organic Chemical Industry Ltd.)

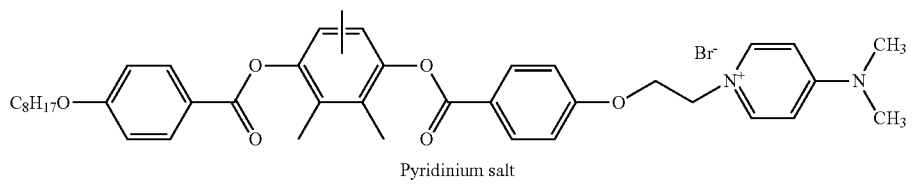

Pyridinium salt

-continued

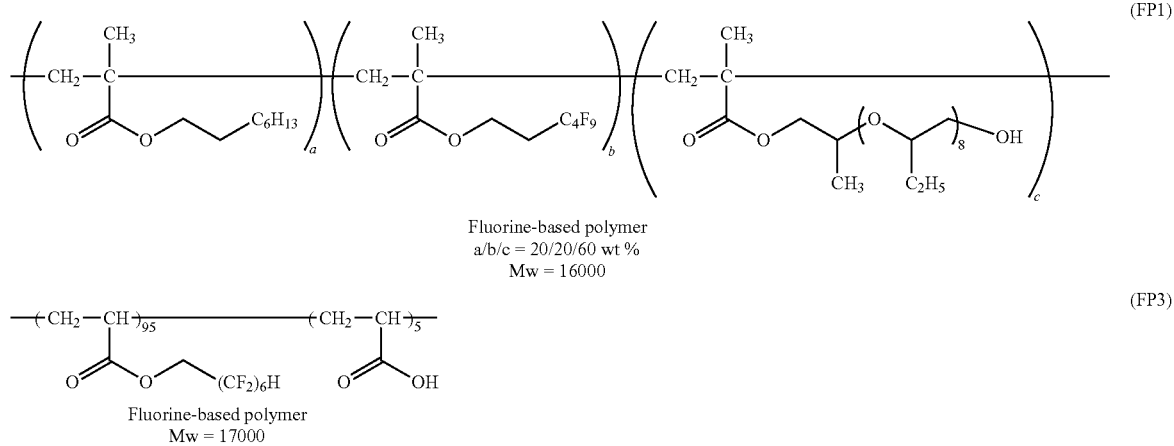

Fluorine-based polymer
a/b/c = 20/20/60 wt %
Mw = 16000

Fluorine-based polymer
Mw = 17000

<Preparation of Switchable Optical Anisotropy Layer 1: TN Liquid Crystal Cell in Example 4)
(Preparation of Liquid Crystal Cell in TN Mode)

Two sheets of glass substrates with ITO electrodes were coated with a horizontal alignment type polyimide alignment film, dried at a high temperature to form an alignment film, and subjected to a rubbing treatment (in this example, the alignment treatment was carried out to perform 90° twist in the vertical direction) so that TN cells were able to be formed. Thereafter, a thermosetting sealing material was sprayed to one of the two substrates, and a bead spacer (diameter of 5 m) was sprayed to the other substrate, and the two substrates were bonded to each other, vacuum-packed, and subjected to a heat treatment, thereby forming an empty liquid crystal cell. A liquid crystal with positive dielectric anisotropy, a refractive index anisotropy Δn of 0.0854 (589 nm, 20° C.), and Δε of +8.5 (MLC-9100, manufactured by Merck KGaA) was injected to the cell using a vacuum liquid crystal injector, and the cell was subjected to a sealing treatment, thereby preparing a TN liquid crystal cell having Δnd of 430 nm. Further, since the inner surfaces of the upper and lower substrates were subjected to a rubbing treatment, the liquid crystal layer was twistedly aligned at a twisted angle of 90° between the upper and lower substrates at the time of no voltage application, and a TN cell in which liquid crystals were aligned in the vertical direction by applying the voltage was completed. Further, a liquid crystal cell having a twisted structure with an optional Δnd was able to be formed by adjusting the spacer diameter.

<Preparation of Switchable Optical Anisotropic Layer 2: VATN Liquid Crystal Cell of Example 5)
(Refractive Index Anisotropic Layer that can be Electrically Controlled)

Two sheets of glass substrates with ITO electrodes were coated with a horizontal alignment type polyimide alignment film, dried at a high temperature to form an alignment film, and subjected to a rubbing treatment (in this example, the alignment treatment was carried out to perform 90° twist in the vertical direction) so that VATN cells were able to be formed. Thereafter, a thermosetting sealing material was sprayed to one of the two substrates, and a bead spacer (diameter of 5 m) was sprayed to the other substrate, and the two substrates were bonded to each other, vacuum-packed, and subjected to a heat treatment, thereby forming an empty liquid crystal cell. A liquid crystal with negative dielectric anisotropy, a refractive index anisotropy Δn of 0.0899 (589 nm, 20° C.), and Δε of −3.6 (MLC-6886, manufactured by Merck KGaA) was injected to the cell using a vacuum liquid crystal injector, and the cell was subjected to a sealing treatment, thereby preparing a VATN liquid crystal cell having Δnd of 450 nm. Further, since the inner surfaces of the upper and lower substrates were subjected to a rubbing treatment, the liquid crystal layer was vertically aligned between the upper and lower substrates at the time of no voltage application and then twistedly aligned by 90° by applying a voltage thereto. Further, a liquid crystal cell having a twisted structure with an optional Δnd was able to be formed by adjusting the spacer diameter.

[Preparation of Optical Laminate]

The prepared light absorption anisotropic layers were appropriately bonded to both surfaces of the various refractive index anisotropic layers prepared above using a commercially available pressure sensitive adhesive SK2057 (manufactured by Soken Chemical & Engineering Co., Ltd.), thereby preparing optical laminates of Examples 1 to 13 and Comparative Example 1. The thickness of SK2057 was approximately 20 μm.

[Preparation of Viewing Angle Control Systems of Examples 1 to 13]

A liquid crystal display device of dynabook (manufactured by Toshiba Corporation), which is a notebook computer equipped with a liquid crystal display device, was disassembled, and various optical laminates prepared above were bonded between a backlight (BL) and a liquid crystal panel using a pressure sensitive adhesive SK2057, thereby preparing an image display device.

Similarly, the image display device of the present invention was able to be realized even in a case where various optical laminates were bonded on a viewing side of a liquid crystal display device of the notebook computer dynabook (manufactured by Toshiba Corporation) using the pressure sensitive adhesive SK2057.

(Evaluation of Oblique Light Shielding Performance of Viewing Angle Control System)

It was confirmed by observation that all the prepared image display devices of Examples 1 to 13 were able to confirm the light shielding property in all azimuths and were capable of satisfactorily controlling the viewing angle. On the contrary, the viewing angle control system of Comparative Example 1 was shielded from light at an azimuthal angle of every 90°, but light was not shielded in other azimuths.

The brightnesses of the prepared image display devices of the examples and the comparative examples were measured, and the ratio obtained by dividing the front brightness by the maximum oblique leaked light (all azimuths, polar angle of 60°) was defined as the front/oblique brightness ratio, and the shielding performance was evaluated. The results are listed in Table 1. The performance of controlling the viewing angle increases as the value increases. Further, the light shielding performance in the security mode was evaluated for Examples 4 and 5 in which the security mode and the wide viewing angle mode can be electrically switched.

The viewing angle control effect was evaluated as low in a case where the value was less than 3: C The viewing angle control effect was evaluated as sufficient in a case where the value was in a range of 3 to 4: B The viewing angle control effect was evaluated as satisfactory in a case where the value was in a range of 4 to 5: A The viewing angle control effect was evaluated as excellent in a case where the value was 5 or greater: AA As listed in Table 1, the image display device of the present invention had more satisfactory oblique light shielding performance as compared with the oblique light shielding performance of Comparative Example 1.

(Evaluation of Moire)

Each of the prepared optical laminates was bonded onto a liquid crystal display device of a smartphone iPhone 8 Plus (registered trademark, manufactured by Apple Inc.), and moire was evaluated.

Further, the iPhone (registered trademark) 8 Plus was a smartphone equipped with a high-definition liquid crystal display device, and the pixel density of the liquid crystal display device was 401 ppi. A black and white stripe pattern in which black and white were alternately disposed for each pixel in the machine direction was displayed on the liquid crystal display device, the black and white stripe pattern was observed from the front, and the moire was visually evaluated. Since the optical laminates of Examples 1 to 13 and Comparative Example 1 did not have a periodic structure that interfered with the pixels of the image display device, moire was not visually recognized and the display device had satisfactory display performance on the front surface. A stripe pattern referred to as moire occurred in a louver film (commercially available product) as described in JP6345732B.

| | | (Examples) | | | | | | |
|---|---|---|---|---|---|---|---|---|
| | | Comparative Example 1 | Example 1 | Example 2 | Example 3 | Switchable Example 4 | Switchable Example 5 | Example 6 |
| Light absorption anisotropic layer | Composition member | Dichroic coloring agent | Dichroic coloring agent | Dichroic coloring agent | Dichroic coloring agent | Dichroic coloring agent | Dichroic coloring agent | Dichroic coloring agent |
| | Alignment degree at 550 nm | 0.92 | 0.92 | 0.92 | 0.92 | 0.92 | 0.92 | 0.92 |
| Refractive index anisotropic layer | Constituent member | PC stretched film | Rod-like liquid crystal | Rod-like liquid crystal | Disk-like liquid crystal | TN liquid crystal cell | VATN liquid crystal cell | Rod-like liquid crystal |
| | Δnd (nm) | 275 (λ/2) | 275 | 450 | 350 | 430 | 450 | 1050 |
| | Twisted angle (degrees) | None | 45 | 90 | 90 | 90 | 90 | 90 |
| | Voltage of liquid crystal cell | — | — | — | — | OFF (0 V) | ON (6 V) | — |
| Ratio of front brightness/oblique brightness | | C | B | A | A | AA | AA | A |

| | | Example 7 | Example 8 | Example 9 | Example 10 | Example 11 | Example 12 | Example 13 |
|---|---|---|---|---|---|---|---|---|
| Light absorption anisotropic layer | Composition member | Dichroic coloring agent | Dichroic coloring agent | Dichroic coloring agent | Dichroic coloring agent | Dichroic coloring agent | Carbon nanotube | Silver nanoparticle |
| | Alignment degree at 550 nm | 0.92 | 0.92 | 0.92 | 0.95 | 0.96 | 0.92 | 0.92 |
| Refractive index anisotropic layer | Constituent member | Rod-like liquid crystal | Rod-like liquid crystal | Rod-like liquid crystal | Reverse dispersion rod-like liquid crystal | Rod-like liquid crystal | Rod-like liquid crystal | Rod-like liquid crystal |

-continued

| | (Examples) | | | | | | |
|---|---|---|---|---|---|---|---|
| Δnd (nm) | 550 | 650 | 650 | 350 | 350 | 450 | 275 |
| Twisted angle (degrees) | 135 | 225 | 315 | 90 | 90 | 90 | 45 |
| Voltage of liquid crystal cell | — | — | — | — | — | — | — |
| Ratio of front brightness/oblique brightness | A | A | A | AA | AA | A | A |

As listed in Table 1, the optical laminate and the image display device of the present invention had satisfactory oblique light shielding performance and satisfactory display performance on the front surface without occurrence of moire.

Further, all the optical laminates (Examples 1 to 3 and 6 to 13) of the present invention had a thickness of 150 μm or less and were easy to bend. Further, the louver film as described in JP6345732B had a thickness of 500 μm and was difficult to bend.

It was confirmed that peeling into a display device can be prevented by disposing the optical laminate according to the embodiment of the present invention on a window glass surface. Further, it was found that the sunshine can be controlled and the power consumption of an air conditioner can be reduced in summer by disposing the optical laminate according to the embodiment of the present invention on a glass surface on which sunlight is incident. Further, it was found that the same effects can be obtained even in a case where the optical laminate is applied to an in-vehicle window.

EXPLANATION OF REFERENCES

1: front viewing direction
2: oblique viewing direction
11, 21: absorption axis
101a: light absorption anisotropic layer
101b: polarizer layer
102: refractive index anisotropic layer (having twisted structure)
102c: liquid crystal cell (having twisted structure)
200: display device
300: liquid crystal layer
301: liquid crystal cell
302a: polarizing plate (viewing side)
302b: polarizing plate (light source side)
400: surface light source
500: retardation layer

What is claimed is:

1. An optical laminate comprising, in order, at least:
a first light absorption anisotropic layer;
a refractive index anisotropic layer formed of a one or more layers that contain a liquid crystal compound having a twisted structure; and
a second light absorption anisotropic layer,
wherein the first light absorption anisotropic layer and the second light absorption anisotropic layer contain an anisotropic absorbing material and each have an absorption axis that is aligned at an angle of 60° to 90° with respect to a film surface, and
wherein a twisted angle of the refractive index anisotropic layer having the twisted structure satisfies Expression I, $$135 \cdot (2n-1) \geq \text{twisted angle (degrees)} \geq 45 \cdot (2n-1) \qquad \text{Expression I}$$

in Expression I, n represents a natural number.

2. The optical laminate according to claim 1,
wherein the first light absorption anisotropic layer and the second light absorption anisotropic layer each have an absorption axis aligned at an angle of 80° to 90° with respect to the film surface.

3. The optical laminate according to claim 1, further comprising:
a first substrate and a second substrate which are respectively disposed on both surfaces of the refractive index anisotropic layer and at least one of which has a transparent electrode,
wherein the refractive index anisotropic layer is a liquid crystal cell, and
the refractive index anisotropic layer, the first substrate, and the second substrate constitute a liquid crystal panel that is electrically birefringently switchable.

4. The optical laminate according to claim 3,
wherein the liquid crystal cell is a TN liquid crystal cell that is electrically birefringently switchable or a VATN liquid crystal cell that exhibits a twisted structure in a voltage applied state.

5. The optical laminate according to claim 1,
wherein the refractive index anisotropic layer is formed by polymerizing a composition containing a disk-like liquid crystal compound or a rod-like liquid crystal compound fixed in a twistedly aligned state in a film thickness direction.

6. The optical laminate according to claim 1,
wherein the anisotropic absorbing material is a dichroic substance.

7. The optical laminate according to claim 6,
wherein the dichroic substance is any one of a dichroic coloring agent, a carbon nanotube, or an anisotropic metal nanoparticle.

8. The optical laminate according to claim 6,
wherein in the first light absorption anisotropic layer and the second light absorption anisotropic layer, a liquid crystal compound and at least one kind of dichroic substance are aligned perpendicularly to a film surface.

9. The optical laminate according to claim 7,
wherein a material of the anisotropic metal nanoparticle is at least one selected from gold, silver, copper, or aluminum.

10. The optical laminate according to claim 1,
wherein a polarizer in which a liquid crystal compound and a dichroic substance are aligned horizontally to the film surface is laminated on one or both of the first light absorption anisotropic layer and the second light absorption anisotropic layer.

11. An image display device comprising:
the optical laminate according to claim 1, which is disposed on a front surface of the image display device.

12. An image display device comprising:
the optical laminate according to claim 1, which is disposed between a liquid crystal cell and a backlight light source.

13. An image display device comprising in order:
the optical laminate according to claim 1;
a retardation layer; and
a polarizer in which an absorption axis is aligned horizontally to a film surface.

14. The image display device according to claim 11, wherein the image display device has a curved surface portion in a display portion.

15. A glass composite comprising at least:
glass; and
the optical laminate according to claim 1.

16. A glass composite which is a laminated glass having an interlayer between two sheets of plate glasses,
wherein the interlayer includes the optical laminate according to claim 1.

17. The optical laminate according to claim 2, further comprising:
a first substrate and a second substrate which are respectively disposed on both surfaces of the refractive index anisotropic layer and at least one of which has a transparent electrode,
wherein the refractive index anisotropic layer is a liquid crystal cell, and
the refractive index anisotropic layer, the first substrate, and the second substrate constitute a liquid crystal panel that is electrically birefringently switchable.

18. The optical laminate according to claim 17
wherein the liquid crystal cell is a TN liquid crystal cell that is electrically birefringently switchable or a VATN liquid crystal cell that exhibits a twisted structure in a voltage applied state.

* * * * *